US006379860B1

(12) United States Patent
Fujimori et al.

(10) Patent No.: US 6,379,860 B1

(45) **Date of Patent: *Apr. 30, 2002**

(54) POSITIVE PHOTOSENSITIVE COMPOSITION

(75) Inventors: Toru Fujimori; Yasunori Takata; Shiro Tan; Toshiaki Aoai, all of Shizuoka (JP)

(73) Assignee: Fuji Photo Film Co., Ltd., Kanagawa (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/220,682

(22) Filed: Dec. 23, 1998

(30) Foreign Application Priority Data

Dec. 26, 1997 (JP) ............................................ 9-361299

(51) Int. Cl.[7] ................................................ G03F 7/004

(52) U.S. Cl. .................................... 430/270.1; 430/914

(58) Field of Search ............................ 430/270.1, 326, 430/914

(56) References Cited

U.S. PATENT DOCUMENTS

| | | | | |
|---|---|---|---|---|
| 5,262,283 A | * | 11/1993 | Sezi et al. | 430/375 |
| 5,558,976 A | * | 9/1996 | Urano et al. | 430/326 |
| 5,670,299 A | * | 9/1997 | Urano et al. | 430/326 |
| 5,750,309 A | * | 5/1998 | Hatakeyama et al. | 430/170 |
| 5,837,420 A | * | 11/1998 | Aoai et al. | 430/270.1 |
| 5,945,251 A | * | 8/1999 | Davidson | 430/270.1 |
| 6,033,826 A | * | 3/2000 | Urano et al. | 430/270.1 |

OTHER PUBLICATIONS

Merck Index on CD–ROM, Version 12:1, 1996, properties of diglyme, methyl cellosolve, methyl ethyl ketone, cyclohexanone, toluene.*

Ashford's Dictionary of Industrial Chemicals, 1994, p. 771.*

Academic Press Dictionary of Science Technology, 1996, NY, CD–ROM Version 1.0, miscible, soluble.*

Chemically Amplified Resists, Lamola, A.A., Solid State Technology, p.53–60, Aug. 1991.*

* cited by examiner

*Primary Examiner*—Rosemary Ashton
(74) *Attorney, Agent, or Firm*—Sughrue Mion, PLLC

(57) ABSTRACT

A positive photosensitive composition is disclosed which comprises a compound generating an acid upon irradiation with actinic rays or a radiation and a resin having groups which decompose by the action of an acid to enhance solubility in an alkaline developing solution, said resin being obtained by reacting an alkali-soluble resin having phenolic hydroxyl groups with at least one specific enol ether compound under acid conditions in a specific organic solvent. The positive photosensitive composition shows improved discrimination between nonimage areas and image areas, has high sensitivity, high resolving power, and high heat resistance, suffers little change in performance with the lapse of time from exposure to light to heat treatment (PED), and is free from defects, e.g., development defects.

2 Claims, No Drawings

POSITIVE PHOTOSENSITIVE COMPOSITION

FIELD OF THE INVENTION

The present invention relates to a positive photosensitive composition for use in the production of lithographic printing plates and semiconductors, e.g., ICs, and the production of circuit boards for liquid crystals, thermal heads, etc., and in other photofabrication processes.

BACKGROUND OF THE INVENTION

Positive photoresist compositions in use generally comprise an alkali-soluble resin and a naphthoquinonediazide compound as a photosensitive substance. For example, photoresist compositions comprising "a combination of a phenolic novolak resin and a naphthoquinonediazide substitution compound" are described in, e.g., U.S. Pat. Nos. 3,666,473, 4,115,128, and 4,173,470. Further, an example of the most typical composition comprising "a combination of a cresol-formaldehyde novolak resin and a trihydroxybenzophenone-1,2-naphthoquinonediazidesulfonic acid ester" is described in L. F. Thompson, "Introduction to Microlithography" (ACS Press, No.2, 19, pp.112–121).

In such a positive photoresist consisting basically of a novolak resin and a quinonediazide compound, the novolak resin imparts high plasma etching resistance and the naphthoquinonediazide compound functions as a dissolution inhibitive agent. The naphthoquinonediazide has the property of generating a carboxylic acid upon light irradiation to thereby lose its dissolution-inhibiting ability and enhance the alkali solubility of the novolak resin.

Many positive photoresists comprising a novolak resin and a photosensitive naphthoquinonediazide compound have been developed and put to practical use so far from the above-described standpoint. These photoresists have produced satisfactory results in the formation of resist patterns having line widths ranging about from 0.8 to 2 μm.

However, the degree of integration in integrated circuits is increasing more and more, and it has become necessary to form an ultrafine pattern having a line width of 0.5 μm or smaller in the production of semiconductor substrates for VLSIs and the like. For attaining the necessary resolution, the wavelengths used in illuminators for photolithography are decreasing more and more and, as a result, use of far ultraviolet rays and excimer laser beams (XeCl, KrF, ArF, etc.) has come to be investigated.

The prior art resists comprising a novolak and a naphthoquinonediazide compound are unsuitable for use in pattern formation by lithography using far ultraviolet rays or excimer laser beams, because the novolak and the naphthoquinonediazide show intense absorption in the far ultraviolet region to render the light less apt to reach the resist bottom. Thus, the resist has low sensitivity to give only a tapered pattern.

One means for eliminating the above problem is the chemical amplification type resist composition described in, e.g., U.S. Pat. No. 4,491,628 and European Patent 249,139. A chemical amplification type positive resist composition is a pattern-forming material in which an acid generates in exposed areas upon irradiation with a radiation such as far ultraviolet rays and this acid catalyzes a reaction that makes the areas irradiated with the actinic rays and the unirradiated areas to differ in solubility in a developing solution to thereby form a pattern on a substrate.

Examples thereof include combinations of a compound which generates an acid upon photodecomposition with an acetal or O,N-acetal compound (see JP-A-48-89003; the term "JP-A" as used herein means an "unexamined published Japanese patent application"), with an orthoester or amidoacetal compound (see JP-A-51-120714), with a polymer having acetal or ketal groups in the backbone (see JP-A-53-133429), with an enol ether compound (see JP-A-55-12995), with an N-acyliminocarbonic acid compound (see JP-A-55-126236), with a polymer having orthoester groups in the backbone (see JP-A-56-17345), with a tertiary alkyl ester compound (see JP-A-60-3625), with a silyl ester compound (see JP-A-60-10247), and with a silyl ether compound (see JP-A-60-37549 and JP-A-60-121446). These combinations show high photosensitivity since they have a quantum efficiency exceeding 1 because of their principle.

Another means for eliminating the problem described hereinabove is a system which is stable over long at room temperature but decomposes upon heating in the presence of an acid to become alkali-soluble. Examples thereof include systems comprising a combination of a compound which generates an acid upon exposure to light with an ester having a tertiary or secondary carbon (e.g., t-butyl or 2-cyclohexenyl) or with a carbonic ester compound, as described in, e.g., JP-A-59-45439, JP-A-60-3625, JP-A-62-229242, JP-A-63-27829, JP-A-63-36240, JP-A-63-250642; *Polym. Eng. Sce.*, Vol.23, p.1012 (1983); ACS. Sym., Vol.242, p.11 (1984); *Semiconductor World*, November 1987 issue, p.91; *Macromolecules*, Vol.21, p.1475 (1988); and *SPIE*, Vol.920, p.42 (1988). Since these systems also have high sensitivity and show reduced absorption in the deep UV region as compared with the naphthoquinonediazide/novolak resin systems, they can be effective systems for coping with the wavelength reduction in illuminators.

The chemical amplification type positive resists described above are roughly divided into three groups: three-component systems comprising an alkali-soluble resin, a compound which generates an acid upon exposure to, e.g., a radiation (photo-acid generator), and a dissolution inhibitive compound for the alkali-soluble resin which has acid-decomposable groups; two-component systems comprising a resin having groups which decompose upon reaction with an acid to become alkali-soluble (acid-decomposable groups) and a photo-acid generator; and 2.5-component systems comprising a resin having groups which decompose upon reaction with an acid to become alkali-soluble, a dissolution inhibitive compound, and a photo-acid generator.

In these two-component, 2.5-component, or three-component chemical amplification type positive resists, the photo-acid generator is caused to generate an acid by exposure to light and the resists are heat-treated and then developed in the presence of the acid to obtain a resist pattern.

Chemical amplification type resists are required to be satisfactory in solubility discrimination between nonimage areas and image areas and to have high resolution. However, conventional resists of the chemical amplification type are still insufficient and a further improvement in resolution is desired. Furthermore, problems concerning lithography defects and development defects are attracting attention as reported recently in, e.g., The Japan Society of Applied Physics. These defects considerably influence the process yield, and this influence becomes serious more and more as the pattern becomes finer. Such defects can be caused by various factors in a process, e.g., the presence of bubbles during development. However, considerable influences on the formation of development defects are exerted by resist compositions, specifically components thereof and impurities present therein. Consequently, resist compositions themselves should be improved.

According to the various patent documents mentioned above, the resin to be used is isolated as a powder from the reaction system. As a result, the resin obtained inevitably contains various impurities which cannot be completely removed by crystallization from water. In addition, since solvents miscible with water in any proportion have been ordinarily used for reactions, it has been impossible to use the technique of water washing extraction/vacuum distillation. Consequently, the prior art methods are insufficient from the standpoint of impurity removal and hence have produced results insufficient in resolution, especially in development defects.

SUMMARY OF THE INVENTION

Accordingly, an object of the present invention is to provide a positive photoresist composition which shows improved discrimination between nonimage areas and image areas, has high sensitivity, high resolution, and high heat resistance, suffers little change in performance with the lapse of time from exposure to light to heat treatment (PED), and is free from defects, e.g., development defects.

As a result of intensive investigations made by the present inventors while taking account of the properties described above, they have found that the object of the present invention is accomplished by the use of a resin obtained by the specific production process described below in a chemical amplification type positive system. The present invention has been achieved based on this finding.

Specifically, the object of the present invention has been found to be accomplished with the following constitutions.

(1) A positive photosensitive composition comprising (a) a compound which generates an acid upon irradiation with actinic rays or a radiation and (b) a resin having groups which decompose by the action of an acid to enhance solubility in an alkaline developing solution, said resin being obtained by reacting an alkali-soluble resin having phenolic hydroxyl groups with at least one compound represented by the following general formula (I) under acid conditions in at least one organic solvent selected from the group consisting of ethylene glycol monoalkyl ethers, ethylene glycol monoalkyl ether acetates, diethylene glycol dialkyl ethers, propylene glycol monoalkyl ethers, propylene glycol dialkyl ethers, propylene glycol monoalkyl ether acetates, lactic esters, esters of aliphatic carboxylic acids, propylene glycol alkyl ether propionates, aromatic hydrocarbons, ketones, amides, and lactones:

General Formula (1)

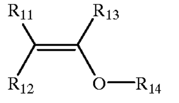

wherein $R_{11}$ to $R_{13}$ may be the same or different, and each represents a hydrogen atom, an alkyl group, an allyl group, an aralkyl group, or a cycloalkyl group; and $R_{14}$ represents an alkyl group, an allyl group, an aralkyl group, or a cycloalkyl group; provided that either $R_{11}$ and $R_{13}$ or $R_{11}$ and $R_{12}$ may be bonded to each other to form either a five- to ten-membered carbon atom ring or a hetero ring containing at least one selected from the group consisting of —O—, —S—, —$SO_2$—, and —N($R_{15}$)—, wherein $R_{15}$ represents an alkyl group, an allyl group, or an aralkyl group, and that $R_{12}$ and $R_{14}$ may be bonded to each other to form a five- to eight-membered ring containing the oxygen atom and carbon atoms.

(2) The positive photosensitive composition as described in (1) above wherein the resin (b) is a resin synthesized by dissolving an alkali-soluble resin having phenolic hydroxyl groups in the organic solvent, subjecting the resultant solution to vacuum distillation, and then adding at least one compound represented by general formula (I) to react the same with the alkali-soluble resin.

(3) The positive photosensitive composition as described in (1) or (2) above wherein the resin (b) is used in the form of a resin solution obtained by reacting an alkali-soluble resin having phenolic hydroxyl groups with at least one compound represented by general formula (I), neutralizing the resultant reaction mixture with a base, subsequently washing and extracting the organic layer with water, and then conducting vacuum distillation.

(4) The positive photosensitive composition as described in any one of (1) to (3) above wherein the resin (b) is used in the form of a solution obtained by reacting an alkali-soluble resin having phenolic hydroxyl groups with at least one compound represented by general formula (I) and then reacting the resultant reaction product with an acid anhydride or a halide within the same reactor without taking out the reaction product during the reaction.

(5) The positive photosensitive composition as described in any one of (1) to (4) above which contains a low-molecular, acid-decomposable, dissolution inhibitive compound having a molecular weight of 3,000 or lower which has one or more groups decomposable by the action of an acid and shows enhanced solubility in an alkaline developing solution by the action of an acid.

Although details are unclear, it has been found that when an ordinary alkali-soluble resin having phenolic hydroxyl groups (phenolic resin) is used as a starting material to protect these phenolic hydroxyl groups with groups which decompose by the action of an acid to enhance solubility in an alkaline developing solution (hereinafter referred to also as "acid-decomposable groups"), then the reaction proceeds in different ways from operation to operation and resin products of constant quality cannot be obtained. It has also been found that impurities are present in the resins synthesized by conventional methods although the amount thereof is only slight, and this considerably influences development defects. Namely, it has been found that when a resin obtained by the prior art method comprising conducting a reaction using a solvent miscible with water in any proportion and recovering the reaction product through, e.g., crystallization from water is used in a composition, then a slight amount of impurities which influence development defects are inevitably present in the composition.

The prior art resin production process, including its basis, was investigated again, and the problem described above could be entirely eliminated according to the present invention by using a reaction solvent which was not a solvent miscible with water in any proportion. It has further been found that when a starting resin is dissolved in the organic solvent and subjected to vacuum distillation before being used in a reaction, then highly satisfactory results are obtained with respect to development defects, although the reasons therefor are unclear. Furthermore, it has been found that a resin containing acid-decomposable groups is obtained as a reaction product of constant and high quality by conducting water washing extraction/vacuum distillation after the reaction, and that a resist composition prepared using this resin has high resolving power and is less apt to cause development defects. These two operations are both highly effective against development defects, although details are unclear. Therefore, a more marked effect is produced by conducting both.

DETAILED DESCRIPTION OF THE INVENTION

The compounds for use in the present invention will be explained below in detail.

[Resin (b)]

Resin (b) is formed from an alkali-soluble resin having phenolic hydroxyl groups and at least one compound represented by general formula (I).

Examples of the alkali-soluble resin having phenolic hydroxyl groups to be used include novolak resins, hydrogenated novolak resins, acetone-pyrogallol resins, poly(o-hydroxystyrene), poly(m-hydroxystyrene), poly(p-hydroxystyrene), hydrogenated poly(hydroxystyrene)s, halogen- or alkyl-substituted poly(hydroxystyrene)s, hydroxystyrene/N-substituted maleimide copolymers, o/p- and m/p-hydroxystyrene copolymers, partially O-alkylated poly(hydroxystyrene)s [e.g., O-methylated, O-(1-methoxy) ethylated, O-(1-ethoxy) ethylated, O-2-tetrahydropyranylated, and O-(t-butoxycarbonyl)methylated poly(hydroxystyrene)s having a degree of substitution at the hydroxyl groups of from 5 to 30 mol %], O-acylated poly(hydroxystyrene)s [e.g., O-acetylated and O-(t-butoxy) carbonylated poly(hydroxystyrene)s having a degree of substitution at the hydroxyl groups of from 5 to 30 mol %], styrene/maleic anhydride copolymers, styrene/hydroxystyrene copolymers, α-methylstyrene/hydroxystyrene copolymers, carboxylated methacrylic resins, and derivatives thereof. However, the alkali-soluble resin to be used for the present invention should not be construed as being limited to these examples.

Especially preferred phenolic resins are novolak resins, poly(o-hydroxystyrene), poly(m-hydroxystyrene), poly(p-hydroxystyrene), copolymers of these hydroxystyrenes, alkyl-substituted poly(hydroxystyrene)s, partially O-alkylated or O-acylated poly(hydroxystyrene)s, styrene/hydroxystyrene copolymers, and α-methylstyrene/hydroxystyrene copolymers.

These phenolic resins have an alkali dissolution rate of preferably 170 Å/sec or higher, more preferably 330 Å/sec or higher, as measured in 0.261 N tetramethylammonium hydroxide (TMAH) at 23° C.

Preferred from the standpoint of attaining a rectangular profile is a phenolic resin having a high far-ultraviolet or excimer laser beam transmittance. Specifically, a 1 μm-thick film of the resin preferably has a transmittance at 248 nm of from 20 to 80%.

The aforementioned phenolic resins such as poly (hydroxystyrene)s, derivatives thereof, and hydroxystyrene copolymers have a weight-average molecular weight of generally 2,000 or higher, preferably from 5,000 to 200,000, more preferably from 10,000 to 100,000.

Weight-average molecular weight herein means that determined by gel permeation chromatography and calculated for standard polystyrene.

In general formula (I), $R_{11}$ to $R_{13}$ may be the same or different, and each represents a hydrogen atom, an alkyl group, an allyl group, an aralkyl group, or a cycloalkyl group. $R_{14}$ represents an alkyl group, an allyl group, an aralkyl group, or a cycloalkyl group. However, either $R_{11}$ and $R_{13}$ or $R_{11}$ and $R_{12}$ may form either a five- to ten-membered carbon atom ring or a ring containing at least one heteroatom selected from —O—, —S—, —$SO_2$—, and —$N(R_{15})$—, wherein $R_{15}$ represents an alkyl group, an allyl group, or an aralkyl group. $R_{12}$ and $R_{14}$ may form a ring containing a five- to eight-membered ring comprising one or more oxygen atoms and carbon atoms.

Preferred examples of the alkyl group represented by $R_{11}$ to $R_{15}$ in general formula (I) include those having 1 to 4 carbon atoms, such as methyl, ethyl, propyl, n-butyl, sec-butyl, and t-butyl. Preferred examples of the allyl group include vinyl. Preferred examples of the aralkyl group include those having 7 to 10 carbon atoms, such as benzyl, phenethyl, and cumyl. Preferred examples of the cycloalkyl group include those having 3 to 10 carbon atoms, such as cyclopropyl, cyclobutyl, cyclohexyl, and adamantyl.

Examples of the five- to ten-membered carbon atom ring formed by either $R_{11}$ and $R_{13}$ or $R_{11}$ and $R_{12}$ include cyclohexyl, cyclopentyl, and cyclobutyl.

Examples of the ring containing at least one heteroatom selected from —O—, —S—, —$SO_2$—, and —$N(R_{15})$— which is formed by either $R_{11}$ and $R_{13}$ or $R_{11}$ and $R_{12}$ include the following structures.

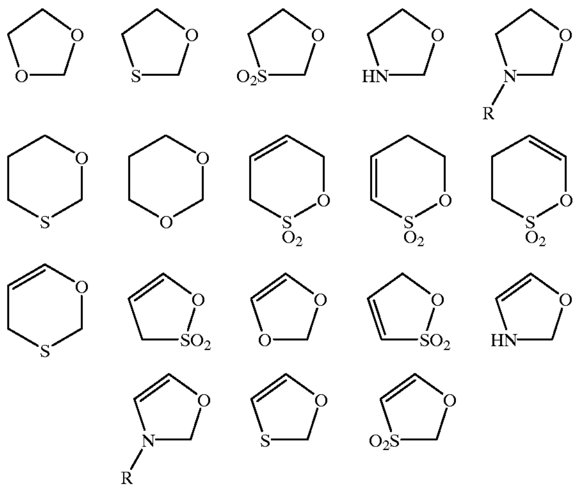

These heterocycles each may have one or more substituents. Each of the above structures is bonded to the structure of general formula (I) through one or two of the carbon atoms thereof.

Examples of the ring formed by $R_{12}$ and $R_{14}$ which contains a five- to eight-membered ring comprising one or more oxygen atoms and carbon atoms include tetrahydropyranyl and tetrahydrofuranyl.

The resin having acid-decomposable groups may further contain other acid-decomposable groups such as those shown below. The acid decomposable groups contained in the resin may be present in the backbone and/or side chains thereof, preferably in side chains thereof.

Preferred examples of the acid-decomposable groups include groups containing a group decomposable by an acid, i.e., —COO—$A^0$ or —O—$B^0$, such as groups represented by —$R^0$—COO—$A^0$ or —Ar—O—$B^0$.

In the above formulae, $A^0$ represents —$C(R^{01})(R^{02})(R^{03})$, —Si $(R^{01})(R^{02})(R^{03})$, or —$C(R^{04})(R^{05})$ —O—$R^{06}$, and $B^0$ represents $A^0$ or —CO—O—$A^0$.

$R^{01}$, $R^{02}$, $R^{03}$, $R^{04}$, and $R^{05}$ may be the same or different and each represents a hydrogen atom, an alkyl group, a cycloalkyl group, an alkenyl group, or an aryl group, and $R^{06}$ represents an alkyl group or an aryl group, provided that at least two of $R^{01}$ to $R^{03}$ are not hydrogen atoms, and that two of $R^{01}$ to $R^{03}$ and two of $R^{04}$ to $R^{06}$ each may be bonded to each other to form a ring. $R^0$ represents an optionally substituted, aliphatic or aromatic hydrocarbon group having a valence of 2 or higher, and —Ar— represents a mono- or polycyclic, optionally substituted, aromatic group having a valence of 2 or higher. Preferred examples of the aliphatic group having a valence of 2 or higher include bivalent groups having 1 to 4 carbon atoms, such as methylene, ethylene, propylene, isopropylene, butylene, isobutylene, and t-butylene, and tri- and tetravalent groups having 1 to 4 carbon atoms, such as methine and ethyne. These groups each may have one or more substituents. Examples of the aromatic group having a valence of 2 or higher include monocyclic groups such as 1,4-phenylene, 1,3-phenylene, and 1,2-phenylene, bicyclic groups such as 1,2-naphthylene, 1,3-naphthylene, 1,4-naphthylene, 1,5-naphthylene, 1,6-naphthylene, 1,7-naphthylene, 1,8-naphthylene, 2,3-naphthylene, 2,4-naphthylene, 2,5-naphthylene, 2,6-naphthylene, 2,7-naphthylene, and 2,8-naphthylene, and tricyclic groups such as anthracene. The aromatic group may also be a fused ring made up of a larger number of rings, and may have one or more substituents.

Preferred examples of the alkyl group include those having 1 to 4 carbon atoms, such as methyl, ethyl, propyl, n-butyl, sec-butyl, and t-butyl. Preferred examples of the cycloalkyl group include those having 3 to 10 carbon atoms, such as cyclopropyl, cyclobutyl, cyclohexyl, and adamantyl. Preferred examples of the alkenyl group include those having 2 to 4 carbon atoms, such as vinyl, propenyl, allyl, and butenyl. Preferred examples of the aryl group include those having 6 to 14 carbon atoms, such as phenyl, xylyl, toluyl, cumenyl, naphthyl, and anthracenyl.

Examples of the substituents include hydroxy, halogen atoms (fluorine, chlorine, bromine, and iodine), nitro, cyano, the aforementioned alkyl groups, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cianamyl, and valeryl, acyloxy groups such as butyryloxy, the aforementioned alkenyl groups, alkenyloxy groups such as vinyloxy, propenyloxy, allyloxy, and butenyloxy, the aforementioned aryl groups, aryloxy groups such as phenoxy, and aryloxycarbonyl groups such as benzoyloxy.

The above-described resin having acid-decomposable groups may contain as repeating units any of the following monomers each having a group stable to acids.

Monomers Having Group Stable to Acids

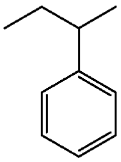
,
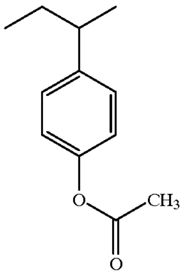
,
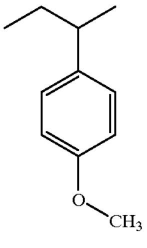
,

-continued

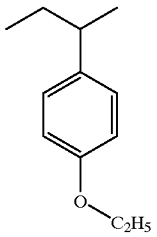
,
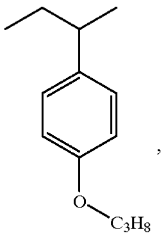
,
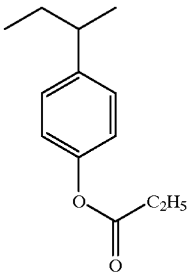
,
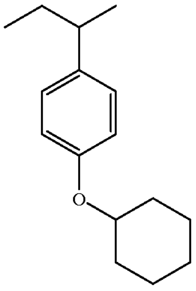
,
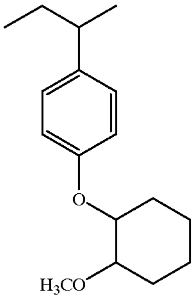
,
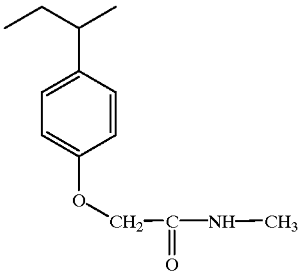
,
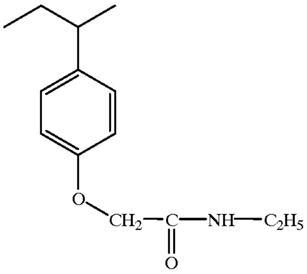
,
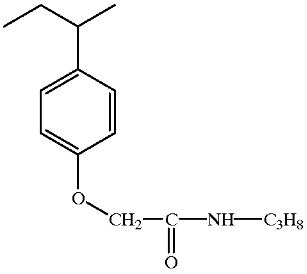
,
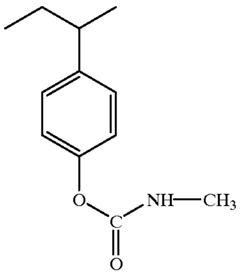
,
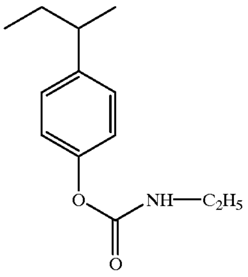
, -continued

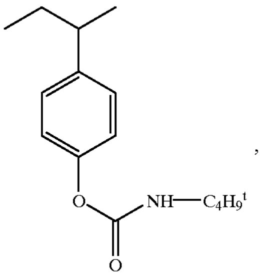

,

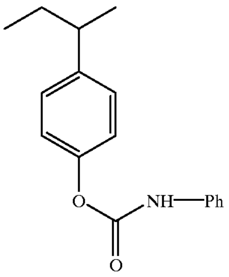

,

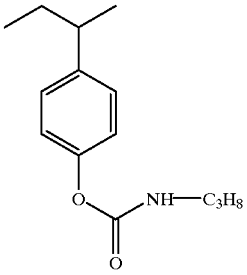

,

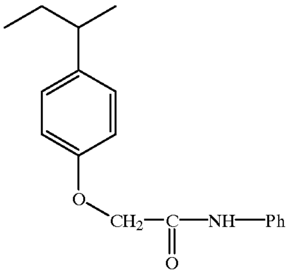

,

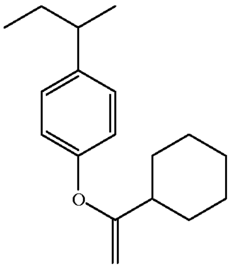

,

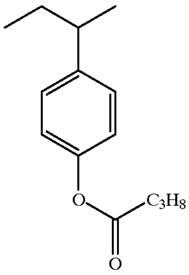

,

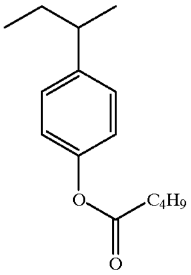

,

Preferred among those resins having acid-decomposable groups are polymers having acetal groups, polymers having acetal groups and t-Boc groups, and polymers having acetal groups and alkylcarbonyl groups.

A resin for use in the present invention can be synthesized, for example, by subjecting a phenolic resin such as those described above to a substitution reaction with an enol ether compound represented by general formula (I) described above. In this synthesis is used a reaction solvent, which may comprise at least one organic solvent selected from the group consisting of ethylene glycol monoalkyl ethers, ethylene glycol monoalkyl ether acetates, diethylene glycol dialkyl ethers, propylene glycol monoalkyl ethers, propylene glycol dialkyl ethers, propylene glycol monoalkyl ether acetates, lactic esters, esters of aliphatic carboxylic acids, propylene glycol alkyl ether propionates, aromatic hydrocarbons, ketones, amides, and lactones.

Specifically, it is preferred to dissolve the phenolic resin in such an organic solvent and conduct vacuum distillation in order to distill off the water. Due to this operation, an always constant water content is attained and, hence, a resin of high quality can be stably obtained. An enol ether compound represented by general formula (I) is added to the resultant solution and an acid catalyst is further added to conduct a reaction.

Examples of the acid catalyst include hydrochloric acid, sulfuric acid, p-toluenesulfonic acid monohydrate, p-toluenesulfonic anhydride, pyridium p-toluenesulfonate, and activated clay. A dehydrating agent and a solvent may be added.

A reaction temperature in the range of from room temperature to the reflux temperature may be suitably selected according to the state of the compound. The amount of the acid catalyst may be slight.

In the above reaction, the phenolic resin and the enol ether compound represented by general formula (I) are preferably added in such an amount that 5 to 50 mol % of all hydroxyl groups in the phenolic resin are substituted by the enol ether group.

In a preferred method according to the present invention, the reaction mixture after completion of the reaction is neutralized with a base, and water is added to the neutralized mixture to conduct extraction. For the purpose of facilitating the extraction, a second organic solvent may be mixed therewith. Although examples of this organic solvent may be the same as those of the reaction solvent which will be given later, the second organic solvent preferably has a lower boiling point than the first organic solvent.

The aqueous layer is removed from the reaction mixture which has undergone the water washing extraction. Thereafter, vacuum distillation is preferably conducted in order to remove the residual water and the second solvent, which is unnecessary. Thus, the resin having acid-decomposable groups is preferably finally obtained as a solution. Although it is therefore preferred to use the same organic solvent as the resist solvent, solvent replacement may be conducted later without any particular limitation.

The finally obtained solution of the resin having acid-decomposable groups has a solid concentration of preferably 10% or higher, more preferably 20% or higher, most preferably 25% or higher. If the solution has too low a solid concentration, troubles may arise in resist solution preparation.

Among the resins usable as resin (b) in the present invention, the resins having acetal groups as the only acid-decomposable groups are synthesized by the method described above. On the other hand, the resins which further contain t-butyloxycarbonyl groups as other acid-decomposable resins or contain alkylcarbonyl (acyl) groups as groups stable to acids are synthesized in the following manner.

As in the synthesis method described above, a phenolic resin is dissolved in an organic solvent and the resultant solution is subjected to vacuum distillation to remove the water. Subsequently, an enol ether compound represented by general formula (I) is added thereto to conduct a reaction. After completion of the reaction, the reaction mixture is neutralized with a base. The resultant intermediate is not taken out from the reaction mixture. To the mixture is further added the corresponding amount of a base, followed by the corresponding acid anhydride to conduct a reaction. Post-treatments are the same as in the above-described method. Various resins can be synthesized by this method.

Specific examples of the reaction solvents usable in the syntheses of resins for use in the present invention are as follows. However, the reaction solvents which can be used for the present invention are not limited thereto.

Examples of the ethylene glycol monoalkyl ethers include ethylene glycol monomethyl ether, ethylene glycol monoethyl ether, ethylene glycol monopropyl ether, and ethylene glycol monobutyl ether.

Examples of the ethylene glycol monoalkyl ether acetates include ethylene glycol monomethyl ether acetate, ethylene glycol monoethyl ether acetate, ethylene glycol monopropyl ether acetate, and ethylene glycol monobutyl ether acetate.

Examples of the diethylene glycol dialkyl ethers include diethylene glycol dimethyl ether, diethylene glycol diethyl ether, diethylene glycol dipropyl ether, and diethylene glycol dibutyl ether.

Examples of the propylene glycol monoalkyl ethers include propylene glycol monomethyl ether, propylene glycol monoethyl ether, propylene glycol monopropyl ether, and propylene glycol monobutyl ether.

Examples of the propylene glycol dialkyl ethers include propylene glycol dimethyl ether, propylene glycol diethyl ether, propylene glycol dipropyl ether, and propylene glycol dibutyl ether.

Examples of the propylene glycol monoalkyl ether acetates include propylene glycol monomethyl ether acetate, propylene glycol monoethyl ether acetate, propylene glycol monopropyl ether acetate, and propylene glycol monobutyl ether acetate.

Examples of the propylene glycol alkyl ether propionates include propylene glycol methyl ether propionate, propylene glycol ethyl ether propionate, propylene glycol propyl ether propionate, and propylene glycol butyl ether propionate.

Examples of the lactic esters include methyl lactate, ethyl lactate, n-propyl lactate, isopropyl lactate, n-butyl lactate, and isobutyl lactate.

Examples of the esters of aliphatic carboxylic acids include methyl formate, ethyl formate, n-propyl formate, isopropyl formate, n-butyl formate, isobutyl formate, n-amyl formate, isoamyl formate, methyl acetate, ethyl acetate, n-propyl acetate, isopropyl acetate, n-butyl acetate, isobutyl acetate, n-amyl acetate, isoamyl acetate, methyl propionate, ethyl propionate, n-propyl propionate, isopropyl propionate, n-butyl propionate, isobutyl propionate, n-amyl propionate, isoamyl propionate, methyl butyrate, ethyl butyrate, n-propyl butyrate, isopropyl butyrate, n-butyl butyrate, isobutyl butyrate, n-amyl butyrate, isoamyl butyrate, ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methQxybutyl acetate, 3-methyl-3-methoxybutyl acetate, 3-methyl-3-methoxybutyl butyrate, methyl acetoacetate, ethyl acetoacetate, methyl pyruvate, and ethyl pyruvate.

Examples of the aromatic hydrocarbons include toluene and xylene.

Examples of the ketones include methyl ethyl ketone, methyl propyl ketone, methyl butyl ketone, 2-heptanone, 3-heptanone, 4-heptanone, and cyclohexanone.

Examples of the amides include N-methylformamide, N,N-dimethylformamide, and N-methylpyrrolidone. Examples of the lactones include $\gamma$-butyrolactone.

The resins usable as resin (b) in the present invention may be used as a mixture of two or more thereof. The use amount of these resins in the present invention is generally from 40 to 99% by weight, preferably from 60 to 95% by weight, based on the total amount of the photosensitive composition (excluding the solvent).

[Compound Generating Acid upon Irradiation with Actinic Rays or Radiation]

Examples of the compound for use in the present invention which generates an acid upon irradiation with actinic rays or a radiation include photoinitiators for cationic photopolymerization, photoinitiators for radical photopolymerization, photodecolorants for dyes, optical color changers, and known compounds which generate an acid by the action of light and are used in microresists, etc. These may be suitably used alone or as a mixture of two or more thereof.

Specific examples thereof include onium salts such as: the diazonium salts described in, e.g., S.I. Schlesinger, *Photogr. Sci. Eng.*, 18, 387 (1974) and T. S. Bal et al., *Polymer*, 21, 423 (1980); the ammonium salts described in, e.g., U.S. Pat. Nos. 4,069,055 and 4,069,056, U.S. Reissued Patent 27,992, and Japanese Patent Application No. 3-140,140; the phosphonium salts described in, e.g., D. C. Necker et al., *Macromolecules*, 17, 2468 (1984), C. S. Wen et al., *Teh, Proc. Conf. Rad. Curing ASIA*, p. 478 Tokyo, Oct (1988), and U.S. Pat. Nos. 4,069,055 and 4,069,056; the iodonium salts described in, e.g., J. V. Crivello et al., Macromolecules, 10 (6), 1307 (1977), *Chem. & Eng. News*, November 28, p. 31 (1988), European Patent 104,143, U.S. Pat. Nos. 339,049 and 410,201, JP-A-2-150,848, and JP-A-2-296,514; the sulfonium salts described in, e.g., J. V. Crivello et al., *Polymer J.*, 17, 73 (1985), J. V. Crivello et al., *J. Org. Chem.*, 43, 3055 (1978), W. R. Watt et al., *J. Polymer Sci., Polymer Chem. Ed.*, 22, 1789 (1984), J. V. Crivello et al., Polymer Bull., 14, 279 (1985), J. V. Crivello et al., *Macromolecules*, 14 (5), 1141 (1981), J. V. Crivello et al., *J. Polymer Sci., Polymer Chem. Ed.*, 17, 2877 (1979), European Patents 370,693, 3,902,114, 233,567, 297,443, and 297,442, U.S. Pat. Nos. 4,933,377, 161,811, 410,201, 339,049, 4,760,013, 4,734,444, and 2,833,827, and German Patents 2,904,626, 3,604,580, and 3,604,581; the selenonium salts described in, e.g., J. V. Crivello et al., *Macromolecules*, 10 (6), 1307 (1977) and J. V. Crivello et al., *J. Polymer Sci., Polymer Chem. Ed.*, 17, 1047 (1979); and the arsonium salts described in, e.g., C. S. Wen et al., *Teh, Proc. Conf. Rad. Curing ASIA*, p. 478 Tokyo, Oct. (1988). Specific examples thereof further include the organohalogen compounds described in, e.g., U.S. Pat. No. 3,905,815, JP-B-46-4605 (the term "JP-B" as used herein means an "examined Japanese patent publication"), JP-A-48-36281, JP-A-55-32070, JP-A-60-239736, JP-A-61-169835, JP-A-61-169837, JP-A-62-58241, JP-A-62-212401, JP-A-63-70243, and JP-A-63-298339; the organometallic compound/organic halide combinations described in, e.g., K. Meier et al., *J. Rad. Curing*, 13 (4), 26 (1986), T. P. Gill et al., *Inorg. Chem.*, 19, 3007 (1980), D. Astruc, *Acc. Chem. Res.*, 19 (12), 377 (1896), and JP-A-2-161445; the photo-acid generators having an o-nitrobenzyl type protective group described in, e.g., S. Hayase et al., *J. Polymer Sci.*, 25, 753 (1987), E. Reichmanis et al., *J. Polymer Sci., Polymer Chem. Ed.*, 23, 1 (1985), Q. Q. Zhu et al., *J. Photochem.*, 36, 85, 39, 317 (1987), B. Amit et al., *Tetrahedron Lett.*, (24) 2205 (1973), D. H. R. Barton et al., *J. Chem Soc.*, 3571 (1965), P. M. Collins et al., *J. Chem. Soc.*, Perkin I, 1695 (1975), M. Rudinstein et al., *Tetrahedron Lett.*, (17), 1445 (1975), J. W. Walker et al., *J. Am. Chem. Soc.*, 110, 7170 (1988), S. C. Busman et al., *J. Imaging Technol.*, 11 (4), 191 (1985), H. M. Houlihan et al., *Macromolecules*, 21, 2001 (1988), P. M. Collins et al., *J. Chem. Soc., Chem. Commun.*, 532 (1972), S. Hayase et al., Macromolecules, 18, 1799 (1985), E. Reichmanis et al., *J. Electrochem. Soc., Solid State Sci. Technol.*, 130 (6), F. M. Houlihan et al., *Macromolecules*, 21, 2001 (1988), European Patents 0,290, 750, 046,083, 156, 535, 271,851, and 0,388,343, U.S. Pat. Nos. 3,901,710 and 4,181,531, JP-A-60-198538, and JP-A-53-133022; compounds which photodecompose to generate a sulfonic acid and are represented by the iminosulfonates described in, e.g., M. Tunooka et al., *Polymer Preprints*, Japan, 35 (8), G.

Berner et al., *J. Rad. Curing*, 13 (4), W. J. Mijs et al., *Coating Technol.*, 55 (697), 45 (1983), Akzo, H. Adachi et al., *Polymer Preprints*, Japan, 37 (3), European Patents 0,199,672, 84,515, 199,672, 044,115, and 0,101,122, U.S. Pat. Nos. 618,564, 4,371,605, and 4,431,774, JP-A-64-18143, JP-A-2-245756, and Japanese Patent Application No. 3-140109; and the disulfone compounds described in, e.g., JP-A-61-166544.

Further, a compound obtained by incorporating such groups or compounds which generate an acid by the action of light into the backbone or side chains of a polymer can be used. Examples of this polymeric compound are given in, e.g., M. E. Woodhouse et al., *J. Am. Chem. Soc.*, 104, 5586 (1982), S. P. Pappas et al., *J. Imaging Sci.*, 30 (5), 218 (1986), S. Kondo et al., *Makromol. Chem., Rapid Commun.*, 9,625 (1988), Y. Yamada et al., *Makromol. Chem.*, 152, 153, 163 (1972), J. V. Crivello et al., *J. Polymer Sci., Polymer Chem. Ed.*, 17, 3845 (1979), U.S. Pat. No. 3,849,137, German Patent 3,914,407, JP-A-63-26653, JP-A-55-164824, JP-A-62-69263, JP-A-63-146038, JP-A-63-163452, JP-A-62-153853, and JP-A-63-146029.

Also usable are the compounds which generate an acid by the action of light as described in, e.g., V. N. R. Pillai, *Synthesis*, (1), 1 (1980), A. Abad et al., *Tetrahedron Lett.*, (47) 4555 (1971), D. H. R. Barton et al., *J. Chem. Soc.*, (C), 329 (1970), U.S. Pat. No. 3,779,778, and European Patent 126,712.

Of the optionally usable compounds enumerated above which generate an acid upon irradiation with actinic rays or a radiation, especially effective compounds are explained below.

(1) Trihalomethyl-substituted oxazole derivatives represented by the following general formula (PAG1) and trihalomethyl-substituted s-triazine derivatives represented by the following general formula (PAG2).

(PAG1)

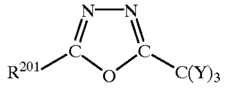

(PAG2)

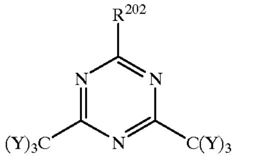

In the above formulae, $R^{201}$ represents a substituted or unsubstituted aryl or alkenyl group; $R^{202}$ represents a substituted or unsubstituted aryl, alkenyl, or alkyl group or $—C(Y)_3$; and Y represents a chlorine or bromine atom.

Specific examples thereof are given below, but the compounds represented by general formula (PAG1) or (PAG2) should not be construed as being limited thereto.

(PAG1-1)

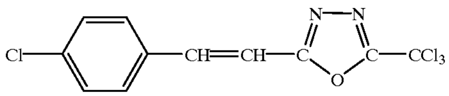

-continued (PAG1-2)

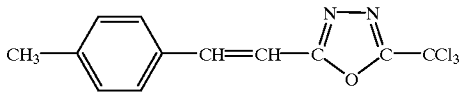

(PAG1-3)

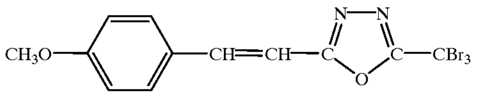

(PAG1-4)

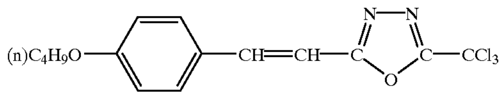

(PAG1-5)

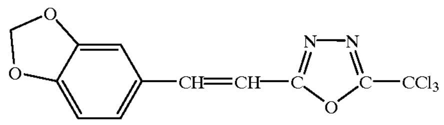

(PAG1-6)

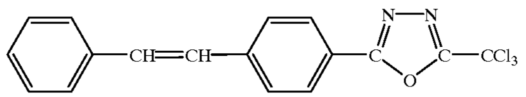

(PAG1-7)

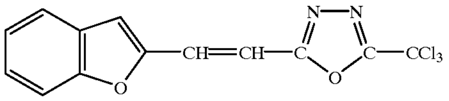

(PAG1-8)

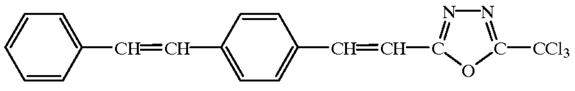

(PAG2-1)

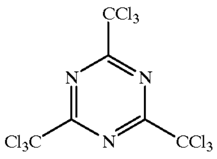

(PAG2-2)

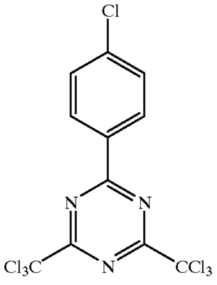

-continued
(PAG2-3)
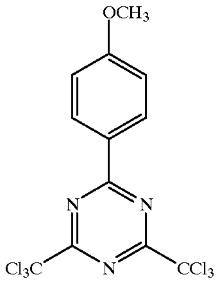
(PAG2-4)
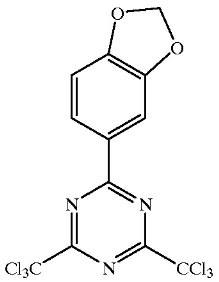
(PAG2-5)
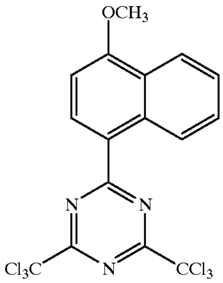
(PAG2-6)
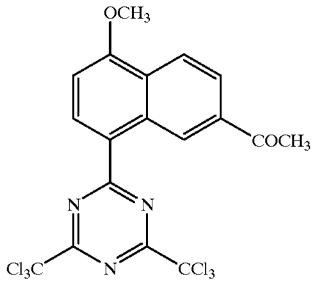
(PAG2-7)
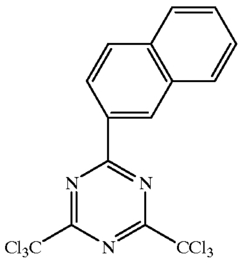
-continued
(PAG2-8)
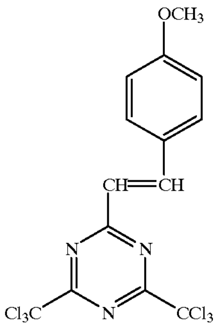
(PAG2-9)
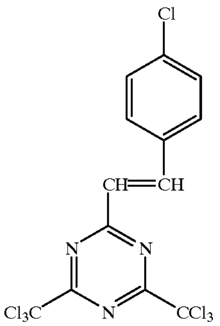
(PAG2-10)
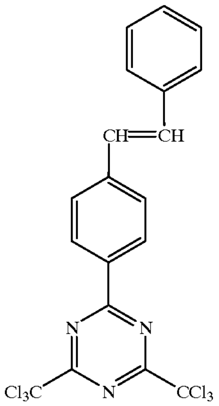
(2) Iodonium salts represented by the following general formula (PAG3) and sulfonium salts represented by the following general formula (PAG4).
(PAG3)
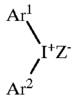
(PAG4)
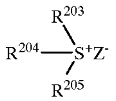

In the above formulae, $Ar^1$ and $Ar^2$ each independently represents a substituted or unsubstituted aryl group. Preferred substituents include alkyl groups, haloalkyl groups, cycloalkyl groups, aryl groups, alkoxy groups, nitro, carboxyl, alkoxycarbonyl groups, hydroxy, mercapto, and halogen atoms.

$R^{203}$, $R^{204}$, and $R^{205}$ each independently represents a substituted or unsubstituted alkyl or aryl group, and preferably represents an aryl group having 6 to 14 carbon atoms, an alkyl group having 1 to 8 carbon atoms, or a substitution derivative thereof. Preferred substituents for the aryl group include alkoxy groups having 1 to 8 carbon atoms, alkyl groups having 1 to 8 carbon atoms, nitro, carboxyl, hydroxy, and halogen atoms. Preferred substituents for the alkyl group include alkoxy groups having 1 to 8 carbon atoms, carboxyl, and alkoxycarbonyl groups.

$Z^-$ represents a counter anion and examples thereof include $BF_4^-$, $AsF_6^-$, $PF_6^-$, $SbF_6^-$, $SiF_6^{2}$—, $ClO_4^-$, perfluoro alkane sulfonic acid anions e.g., $CF_3SO_3^-$, pentafuluoro benzene sulfonic acid anion, condensation high-valence aromatic sulfonic acid anions, e.g., naphthalene-1-sulfonic acid anion, anthraquinone surfonic acid anion, and a dye having a sufonic acid group. However, the compounds should not be construed as being limited thereto.

Two of $R^{203}$, $R^{204}$, and $R^{205}$ may be bonded to each other through a single bond or substituent thereof. $Ar^1$ and $Ar^2$ may be bonded to each other likewise.

Specific examples thereof are given below, but the compounds represented by general formula (PAG3) or (PAG4) should not be construed as being limited thereto.

(PAG3-1)

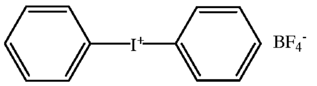

(PAG3-2)

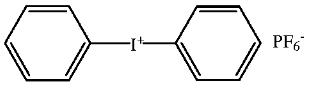

(PAG3-3)

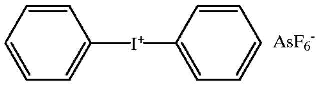

(PAG3-4)

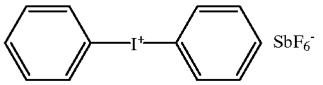

(PAG3-5)

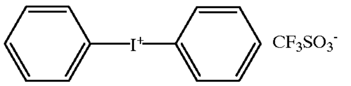

(PAG3-6)

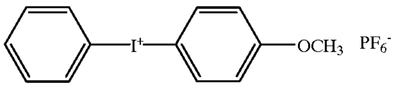

(PAG3-7)

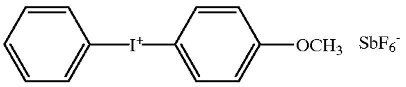

-continued (PAG3-8)

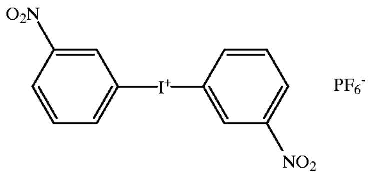

(PAG3-9)

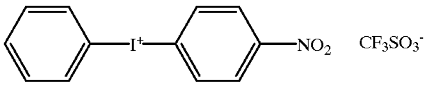

(PAG3-10)

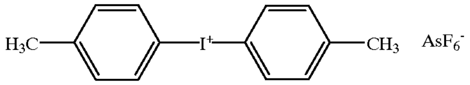

(PAG3-11)

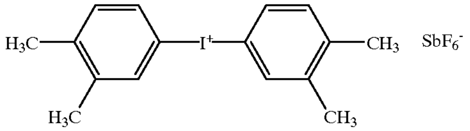

(PAG3-12)

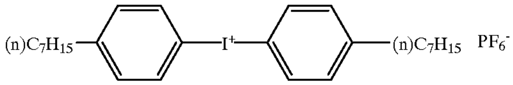

(PAG3-13)

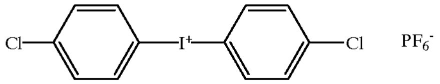

(PAG3-14)

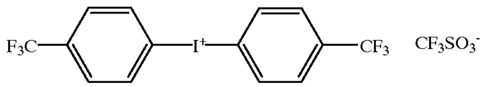

(PAG3-15)

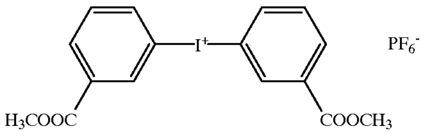

(PAG3-16)

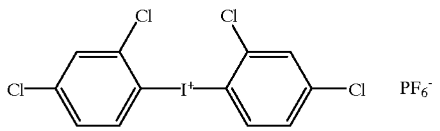

(PAG3-17)

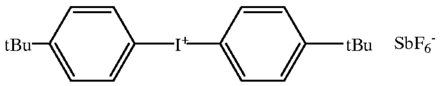

(PAG3-18)

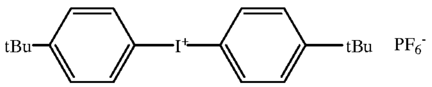

-continued
(PAG3-19)
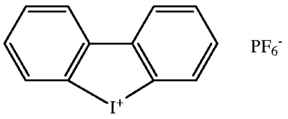
(PAG3-20)
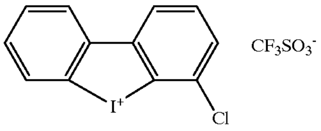
(PAG3-21)
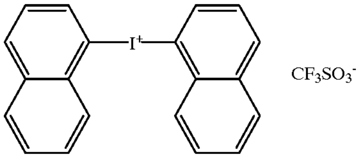
(PAG3-22)
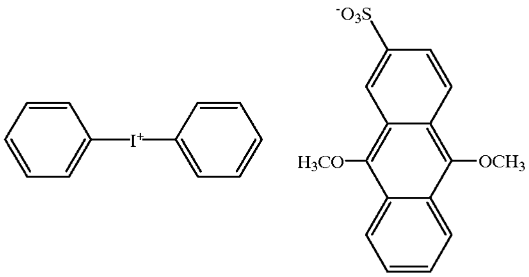
(PAG3-23)
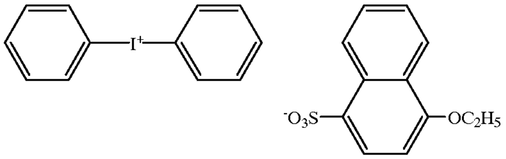
(PAG3-24)
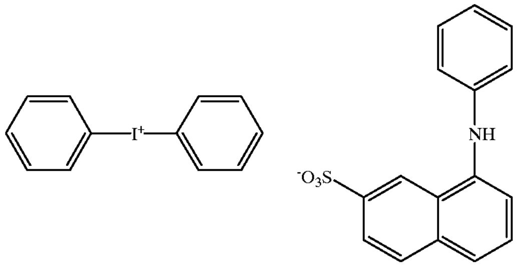
(PAG3-25)
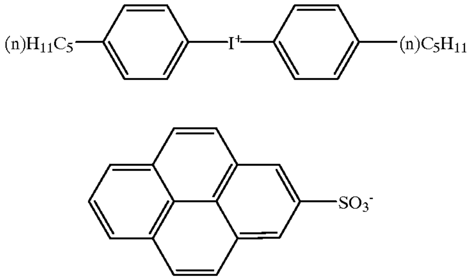
-continued
(PAG3-26)
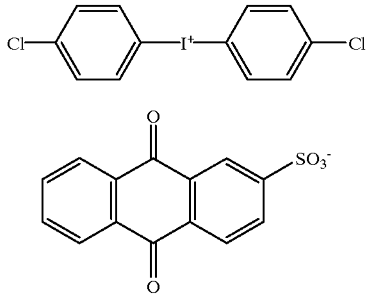
(PAG3-27)
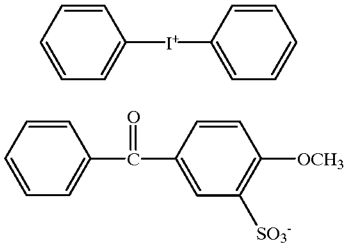
(PAG4-1)
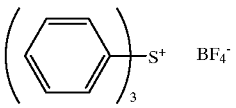
(PAG4-2)
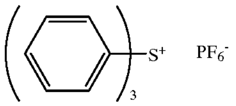
(PAG4-3)
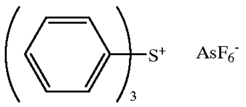
(PAG4-4)
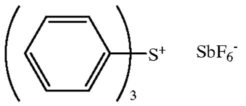
(PAG4-5)
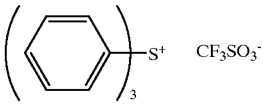
(PAG4-6)
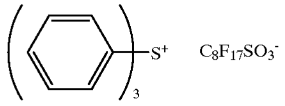
(PAG4-7)
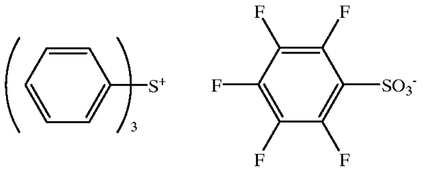

-continued
(PAG4-8)
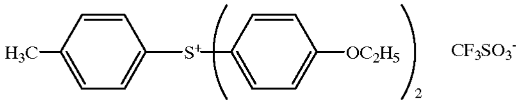
(PAG4-9)
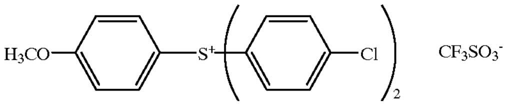
(PAG4-10)
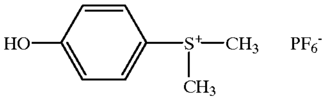
(PAG4-11)
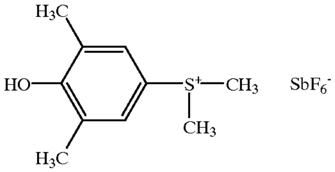
(PAG4-12)
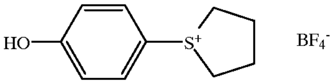
(PAG4-13)
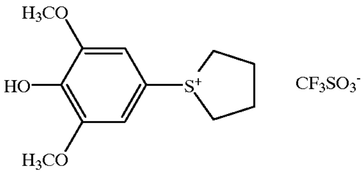
(PAG4-14)
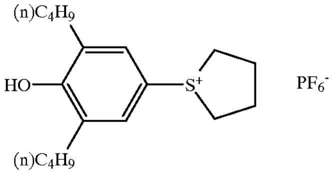
(PAG4-15)
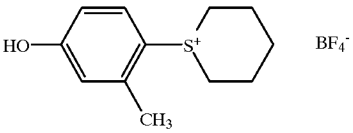
(PAG4-16)
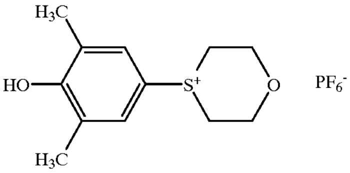
-continued
(PAG4-17)
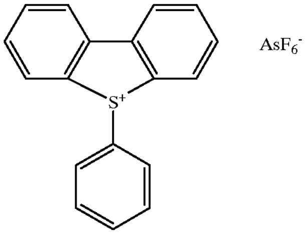
(PAG4-18)
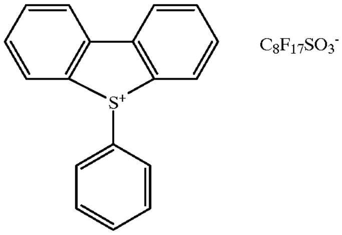
(PAG4-19)
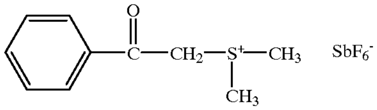
(PAG4-20)
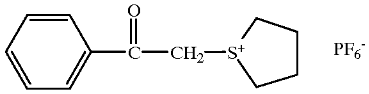
(PAG4-21)
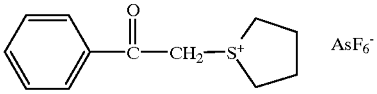
(PAG4-22)
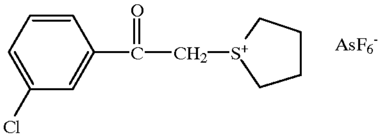
(PAG4-23)
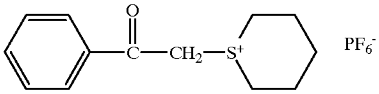
(PAG4-24)
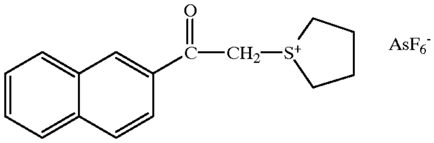
(PAG4-25)
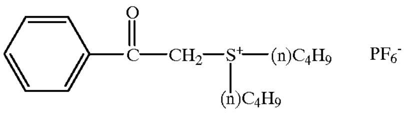

-continued (PAG4-26)

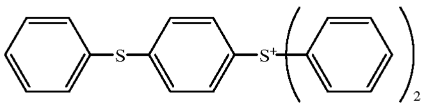

$C_8H_{17}SO_3^-$ (PAG4-27)

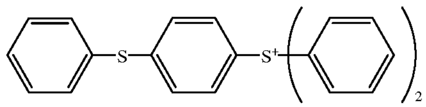

$SbF_6^-$ (PAG4-28)

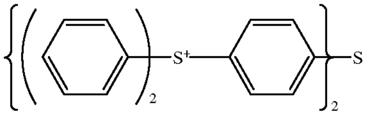

$2CF_3SO_3^-$ (PAG4-29)

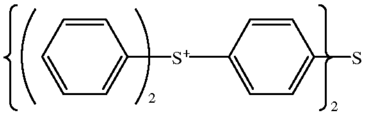

$2AsF_6^-$ (PAG4-30)

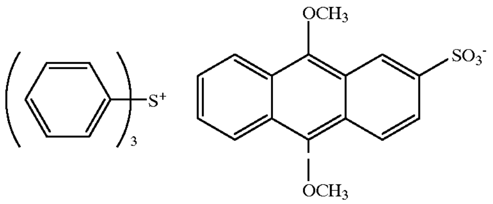

(PAG4-31)

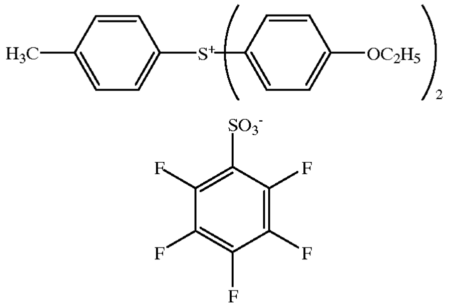

(PAG4-32)

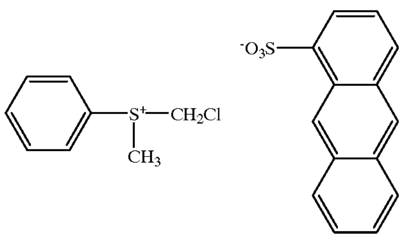

(PAG4-33)

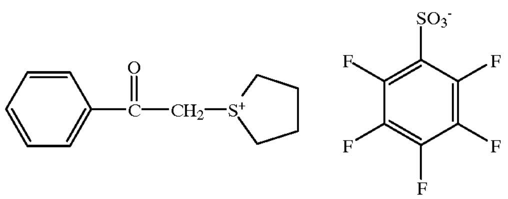

-continued (PAG4-34)

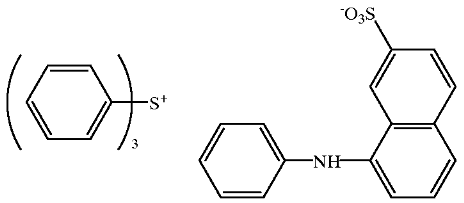

(PAG4-35)

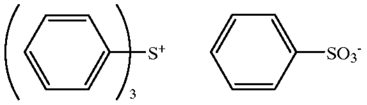

(PAG4-36)

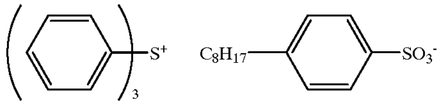

The onium salts represented by general formulae (PAG3) and (PAG4) are known. They can be synthesized, for example, by the methods described in, e.g., J. W. Knapczyk et al., *J. Am. Chem. Soc.*, 91, 145 (1969), A. L. Maycok et al., *J. Org. Chem.*, 35, 2535 (1970), E. Goethas et al., *Bull. Soc. Chem. Belg.*, 73, 546 (1964), H. M. Leicester, *J. Ame. Chem. Soc.*, 51, 3587 (1929), J. V. Crivello et al., *J. Polym. Chem. Ed.*, 18, 2677 (1980), U.S. Pat. Nos. 2,807,648 and 4,247,473, and JP-A-53-101331.

(3) Disulfone derivatives represented by the following general formula (PAG5) and iminosulfonate derivatives represented by the following general formula (PAG6).

(PAG5)

$$Ar^3—SO_2—SO_2—Ar^4$$

(PAG6)

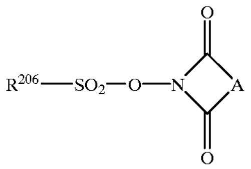

In the above formulae, $Ar^3$ and $Ar^4$ each independently represents a substituted or unsubstituted aryl group; $R^{206}$ represents a substituted or unsubstituted alkyl or aryl group; and A represents a substituted or unsubstituted alkylene, alkenylene, or arylene group.

Specific examples thereof are given below, but the compounds represented by general formula (PAG5) or (PAG6) should not be construed as being limited thereto.

(PAG5-1)

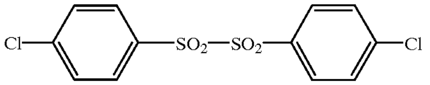

(PAG5-2)

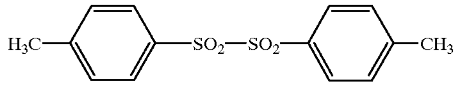

-continued
(PAG5-3)
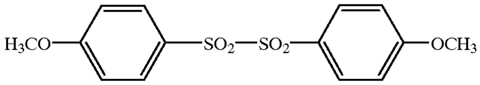
(PAG5-4)
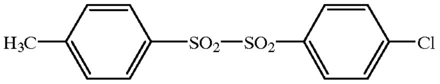
(PAG5-5)
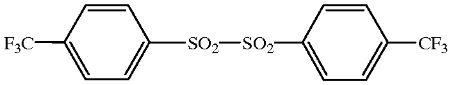
(PAG5-6)
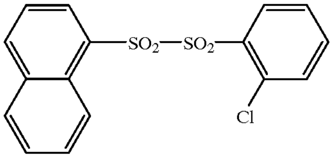
(PAG5-7)
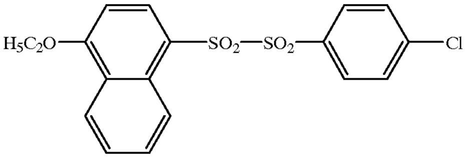
(PAG5-8)
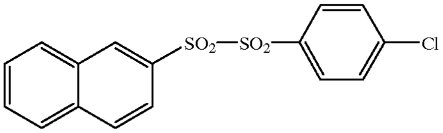
(PAG5-9)
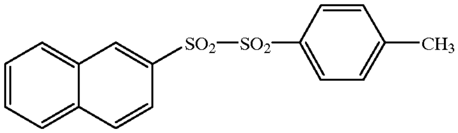
(PAG5-10)
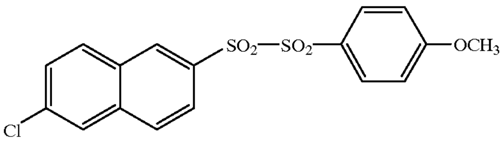
(PAG5-11)
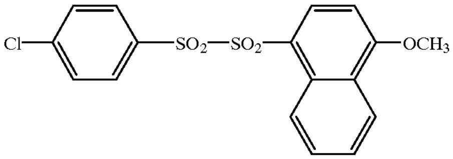
(PAG5-12)
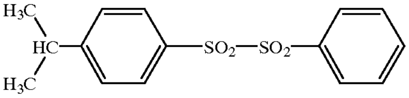
-continued
(PAG5-13)
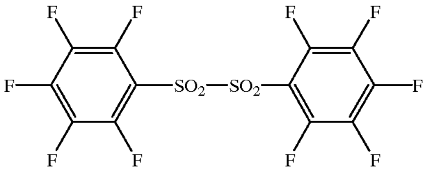
(PAG5-14)
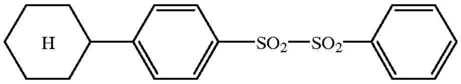
(PAG6-1)
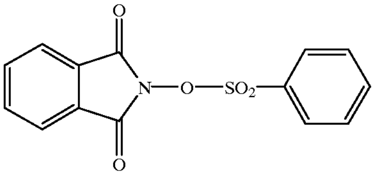
(PAG6-2)
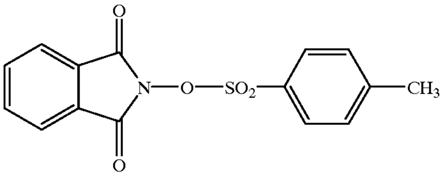
(PAG6-3)
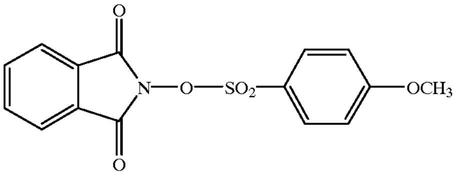
(PAG6-4)
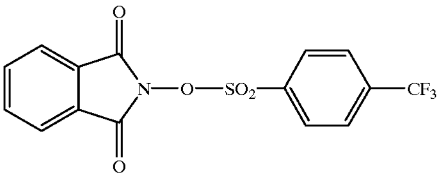
(PAG6-5)
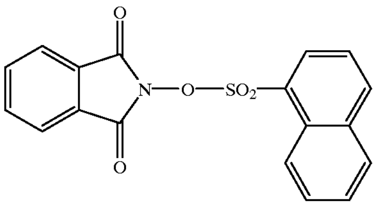
(PAG6-6)
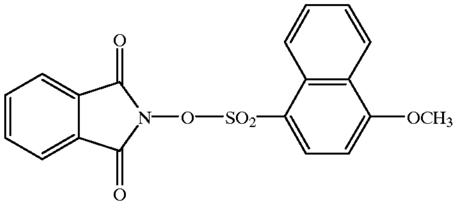

-continued (PAG6-7)

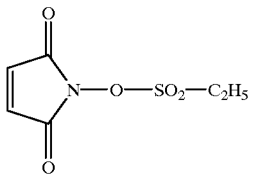

(PAG6-8)

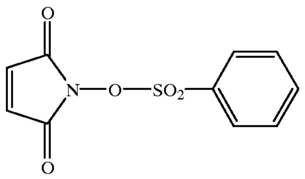

(PAG6-9)

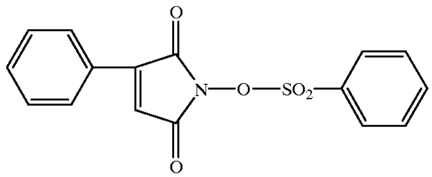

(PAG6-10)

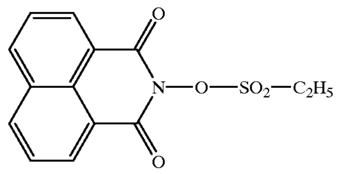

(PAG6-11)

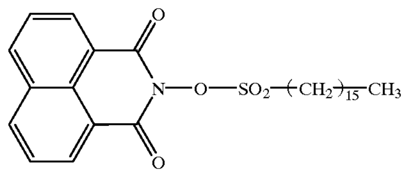

(PAG6-12)

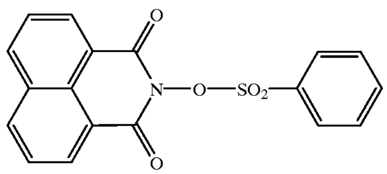

(PAG6-13)

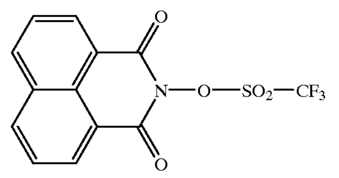

(PAG6-14)

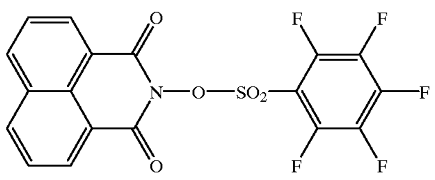

-continued (PAG6-15)

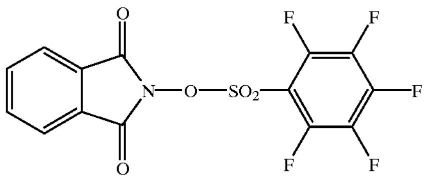

(PAG6-16)

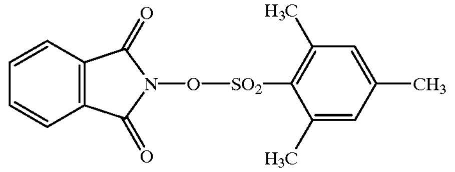

(PAG6-17)

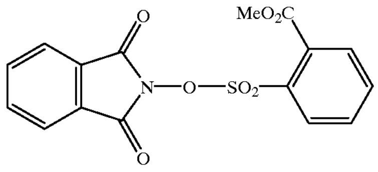

(PAG6-18)

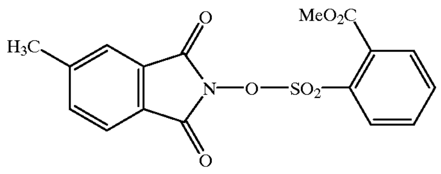

(PAG6-19)

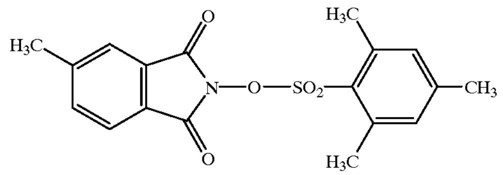

(PAG6-20)

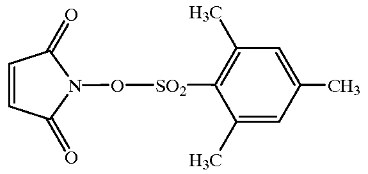

The amount of the compound generating an acid upon irradiation with actinic rays or a radiation is generally from 0.001 to 40% by weight, preferably from 0.01 to 20% by weight, more preferably from 0.1 to 10% by weight, based on the total amount of the photosensitive composition (excluding the solvent).

Low-molecular Acid-decomposable Dissolution Inhibitive Compound

A low-molecular acid-decomposable dissolution inhibitive compound is preferably used in the present invention.

The acid-decomposable dissolution inhibitive compound for use in the present invention is a compound which has at least two acid-decomposable groups in the molecular structure and in which the two acid-decomposable groups most apart from each other are separated by at least 8 bonding atoms.

In the present invention, the acid-decomposable dissolution inhibitive compound is desirably either a compound which has at least two acid-decomposable groups in the molecular structure and in which the two acid-decomposable groups most apart from each other are separated by at least 10, preferably at least 11, more preferably at least 12 bonding atoms, or a compound which has at least three acid-decomposable groups and in which the two acid-decomposable groups most apart from each other are separated by at least 9, preferably at least 10, more preferably at least 11 bonding atoms. The upper limit of the bonding atoms by which the two acid-decomposable groups most apart from each other are separated is preferably 50, more preferably 30.

In the case where the acid-decomposable dissolution inhibitive compound has three or more, desirably four or more acid-decomposable groups, the compound exhibits an extremely improved dissolution inhibiting effect on the alkali-soluble resin when the acid-decomposable groups are apart from each other at least at a given distance. This is true also in the case where the acid-decomposable dissolution inhibitive compound has two acid-decomposable groups.

The distance between acid-decomposable groups in the present invention is expressed in terms of the number of bonding atoms present between the groups, excluding the atoms contained in the groups. For example, in each of compounds (1) and (2) shown below, the distance between acid-decomposable groups is 4 bonding atoms. In compound (3), that distance is 12 bonding atoms.

(1)

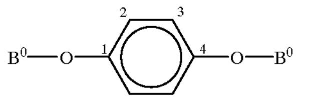

$A^0$—OOC—$^1CH_2$—$^2CH_2$—$^4CH_2$—COO—$A^0$ (2)

(3)

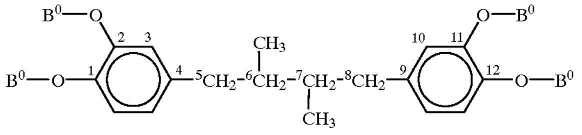

acid-decomposable group: —COO—$A^0$, —O—$B^0$

Although the acid-decomposable dissolution inhibitive compound for use in the present invention may have two or more acid-decomposable groups on the same benzene ring, it is preferably a compound having a framework in which each benzene ring does not have more than one acid-decomposable group. The molecular weight of the acid-decomposable dissolution inhibitive compound for use in the present invention is 3,000 or lower, preferably from 500 to 3,000, more preferably from 1,000 to 2,500.

In a preferred embodiment of the present invention, examples of groups containing an acid-decomposable group, i.e., —COO—$A^0$ or —O—$B^0$, include groups represented by —$R^0$—COO—$A^0$ or —Ar—O—$B^0$.

In the above formulae, $A^0$ represents —C($R^{01}$)($R^{02}$)(R03), —Si ($R^{01}$)($R^{02}$)($R^{03}$) or —C($R^{04}$)($R^{05}$) —O—$R^{06}$, and $B^0$ represents $A^0$ or —CO—O—$A^0$).

$R^{01}$, $R^{02}$, $R^{03}$, $R^{04}$, and $R^{05}$ may be the same or different and each represents a hydrogen atom, an alkyl group, a cycloalkyl group, an alkenyl group, or an aryl group, and $R^{06}$ represents an alkyl group or an aryl group, provided that at least two of $R^{01}$ to $R^{03}$ are not hydrogen atoms, and that two of $R^{01}$ to $R^{03}$ or two of $R^{04}$ to $R^{05}$ may be bonded to each other to form a ring. $R^0$ represents an optionally substituted, aliphatic or aromatic hydrocarbon group having a valence of 2 or higher, and —Ar— represents an optionally substituted, mono-or polycyclic aromatic group having a valence of 2 or higher.

The alkyl group is preferably one having 1 to 4 carbon atoms, such as methyl, ethyl, propyl, n-butyl, sec-butyl, or t-butyl. The cycloalkyl group is preferably one having 3 to 10 carbon atoms, such as cyclopropyl, cyclobutyl, cyclohexyl, or adamantyl. The alkenyl group is preferably one having 2 to 4 carbon atoms, such as vinyl, propenyl, allyl, or butenyl. The aryl group is preferably one having 6 to 14 carbon atoms, such as phenyl, xylyl, toluyl, cumenyl, naphthyl, or anthracenyl.

Examples of the substituents include hydroxy, halogen atoms (fluorine, chlorine, bromine, and iodine), nitro, cyano, the alkyl groups enumerated above, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cyanamyl, and valeryl, acyloxy groups such as butyryloxy, the alkenyl groups enumerated above, alkenyloxy groups such as vinyloxy, propenyloxy, allyloxy, and butenyloxy, the aryl groups enumerated above, aryloxy groups such as phenoxy, and aryloxycarbonyl groups such as benzoyloxy.

Desirable examples of the acid-decomposable groups include silyl ether groups, cumyl ester groups, acetal groups, tetrahydropyranyl ether groups, enol ether groups, enol ester groups, tertiary alkyl ether groups, tertiary alkyl ester groups, and tertiary alkyl carbonate groups. Preferred of these are tertiary alkyl ester groups, tertiary alkyl carbonate groups, cumyl ester groups, and tetrahydropyranyl ether groups.

Desirable acid-decomposable dissolution inhibitive compounds include compounds obtained from the polyhydroxy compounds given in the patent documents specified below by protecting part or all of the phenolic OH groups by bonding thereto protective groups shown above, i.e., groups represented by —$R^0$—COO—$A^0$ or $B^0$; the patent documents include JP-A-1-289946, JP-A-1-289947, JP-A-2-2560, JP-A-3-128959, JP-A-3-158855, JP-A-3-179353, JP-A-3-191351, JP-A-3-200251, JP-A-3-200252, JP-A-3-200253, JP-A-3-200254, JP-A-3-200255, JP-A-3-259149, JP-A-3-279958, JP-A-3-279959, JP-A-4-1650, JP-A-4-1651, JP-A-4-11260, JP-A-4-12356, JP-A-4-12357, and Japanese Patent Applications Nos. 3-33229, 3-230790, 3-320438, 4-25157, 4-52732, 4-103215, 4-104542, 4-107885, 4-107889, and 4-152195.

Preferred of these are the compounds obtained from the polyhydroxy compounds given in JP-A-1-289946, JP-A-3-128959, JP-A-3-158855, JP-A-3-179353, JP-A-3-200251, JP-A-3-200252, JP-A-3-200255, JP-A-3-259149, JP-A-3-279958, JP-A-4-1650, JP-A-4-11260, JP-A-4-12356, JP-A-4-12357, Japanese Patent Applications Nos. 4-25157, 4-103215, 4-104542, 4-107885, 4-107889, and 4-152195.

Specifically, such acid-decomposable dissolution inhibitive compounds are represented by general formulae [I] to [XVI].

-continued
[I]
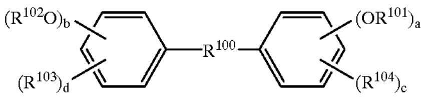
[II]
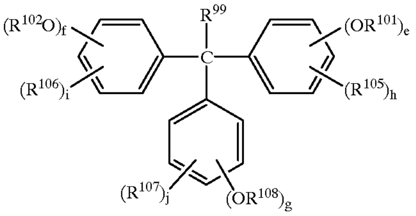
[III]
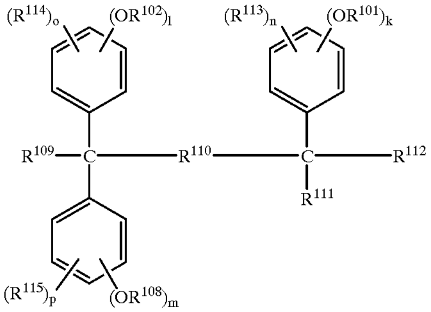
[IV]
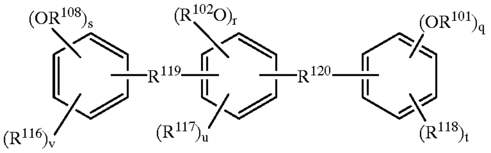
[V]
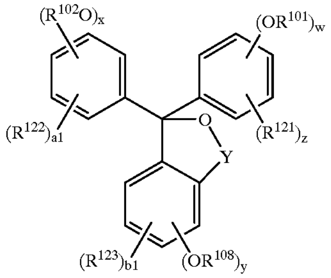
[VI]
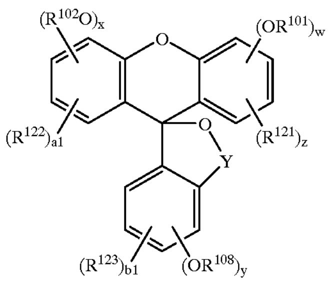
[VII]
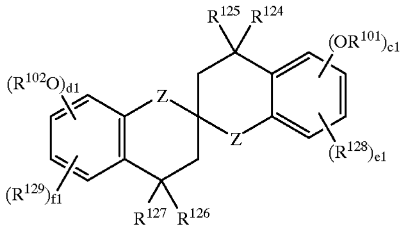
[VIII]
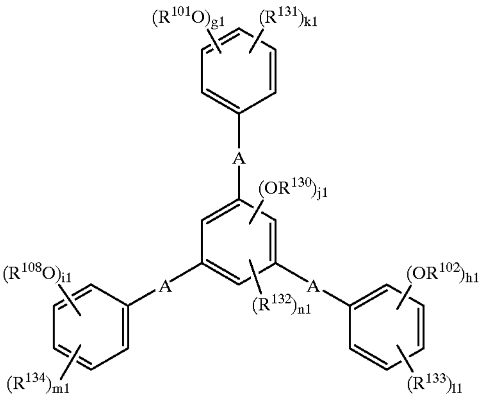
[IX]
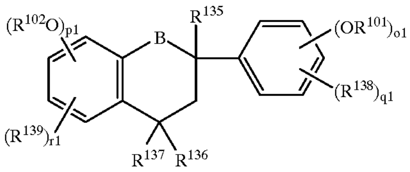
[X]
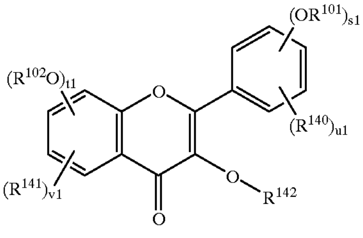
[XI]
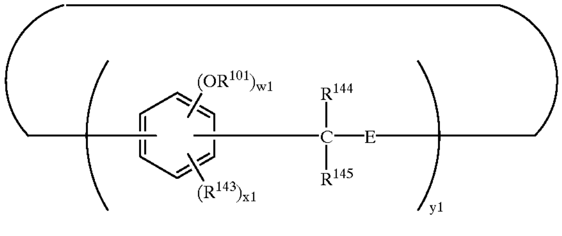

-continued

[XII]

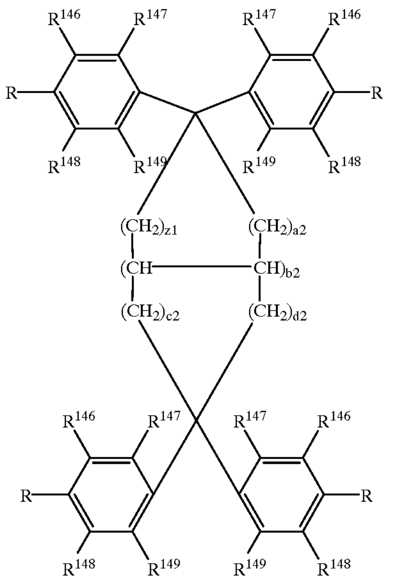

In the above formulae, $R^{101}$, $R^{102}$, $R^{108}$, and $R^{130}$ may be the same or different and each represents a hydrogen atom, —$R^0$—COO—$C(R^{01})(R^{02})(R^{03})$, or —CO—O—$C(R^{01})(R^{02})(R^{03})$, wherein $R^0$, $R^{01}$, $R^{02}$, and $R^{03}$ have the same meanings as defined hereinabove;

$R^{100}$ represents —CO—, —COO—, —NHCONH—, —NHCOO—, —O—, —S—, —SO—, —$SO_2$—, —$SO_3$—, or a group represented by

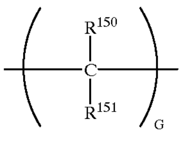

where

G is 2 to 6, provided that when G is 2, at least either of $R^{150}$ and $R^{151}$ is an alkyl group, $R^{150}$ and $R^{151}$ may be the same or different and each represents a hydrogen atom, an alkyl group, an alkoxy group, —OH, —COOH, —CN, a halogen atom, —$R^{1521}$—$COOR^{153}$, or —$R^{154}$—OH, $R^{152}$ and $R^{154}$ each represents an alkylene group, and $R^{153}$ represents a hydrogen atom, an alkyl group, an aryl group, or an aralkyl group;

$R^{99}$, $R^{103}$ to $R^{107}$, $R^{109}$, $R^{111}$ to $R^{118}$, $R^{121}$ to $R^{123}$, $R^{128}$ to $R^{129}$, $R^{131}$ to $R^{134}$, $R^{138}$ to $R^{141}$, and $R^{143}$ may be the same or different and each represents a hydrogen atom, a hydroxyl group, an alkyl group, an alkoxy group, an acyl group, an acyloxy group, an aryl group, an aryloxy group, an aralkyl group, an aralkyloxy group, a halogen atom, a nitro group, a carboxyl group, a cyano group, or —$N(R^{155})(R^{156})$(where $R^{155}$ and $R^{156}$ each represents H, an alkyl group, or an aryl group);

$R^{110}$ represents a single bond, an alkylene group, or a group represented by

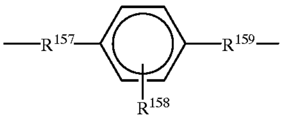

where $R^{157}$ and $R^{159}$ may be the same or different and each represents a single bond, an alkylene group, —O—, —S—, —CO—, or a carboxyl group, and $R^{158}$ represents a hydrogen atom, an alkyl group, an alkoxy group, an acyl group, an acyloxy group, an aryl group, a nitro group, a hydroxyl group, a cyano group, or a carboxyl group, provided that each hydroxyl group may be replaced by an acid-decomposable group (e.g., t-butoxycarbonylmethyl, tetrahydropyranyl, 1-ethoxy-1-ethyl, or 1-t-butoxy-1-ethyl);

$R^{119}$ and $R^{120}$ may be the same or different and each represents a methylene group, a lower-alkyl-substituted methylene group, a halomethylene group, or a haloalkyl group, provided that the term "lower alkyl" herein means an alkyl group having 1 to 4 carbon atoms;

$R^{124}$ to $R^{127}$ may be the same or different and each represents a hydrogen atom or an alkyl group;

$R^{135}$ to $R^{137}$ may be the same or different and each represents a hydrogen atom, an alkyl group, an alkoxy group, an acyl group, or an acyloxy group;

$R^{142}$ represents a hydrogen atom, —$R^0$—COO—$C(R^{01})(R^{02})(R^{03})$, —CO—O—$C(R^{01})(R^{02})(R^{03})$, or the group represented by

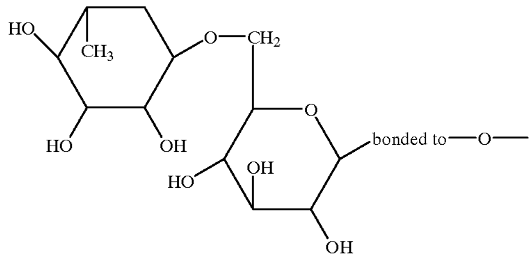

$R^{144}$ and $R^{145}$ may be the same or different and each represents a hydrogen atom, a lower alkyl group, a lower haloalkyl group, or an aryl group;

$R^{146}$ to $R^{149}$ may be the same or different and each represents a hydrogen atom, a hydroxyl group, a halogen atom, a nitro group, a cyano group, a carbonyl group, an alkyl group, an alkoxy group, an alkoxycarbonyl group, an aralkyl group, an aralkyloxy group, an acyl group, an acyloxy group, an alkenyl group, an alkenyloxy group, an aryl group, an aryloxy group, or an aryloxycarbonyl group, provided that the four groups represented by the same symbol need not be the same;

Y represents —CO— or —$S_2$—;

Z and B each represents a single bond or —O—;

A represents a methylene group, a lower-alkyl-substituted methylene group, a halomethylene group, or a haloalkyl group;

E represents a single bond or an oxymethylene group;

when any of a to z and a1 to y1 is 2 or a larger integer, the groups in the parentheses may be the same or different;

a to q, s, t, v, g1 to i1, k1 to m1, o1, q1, s1, and u1 each represents 0 or an integer of 1 to 5;

r, u, w, x, y, z, a1 to f1, p1, r1, t1, and v1 to x1 each represents 0 or an integer of 1 to 4;

j1, n1, z1, a2, b2, c2, and d2 each represents 0 or an integer of 1 to 3;

at least one of z1, a2, c2, and d2 is 1 or larger;

y1 is an integer of 3 to 8;

(a+b), (e+f+g), (k+l+m), (q+r+s), (w+x+y), (c1+d1), (g1+h1+i1+j1), (o1+p1), and (s1+t1) each is 2 or larger;

(j1+n1) is 3 or smaller;

(r+u), (w+z), (x+a1), (y+b1), (c1+e1), (d1+f1), (p1+r1), (t1+v1), and (x1+w1) each is 4 or smaller, provided that in general formula [V], (w+z) and (x+a1) each is 5 or smaller; and (a+c), (b+d), (e+h), (f+i), (g+j), (k+n), (l+o), (m+p), (q+t) (s+v), (g1+k1), (h1+l1), (i1+m1), (o1+q1), and (s1+u1) 5 or smaller.

(XIII)

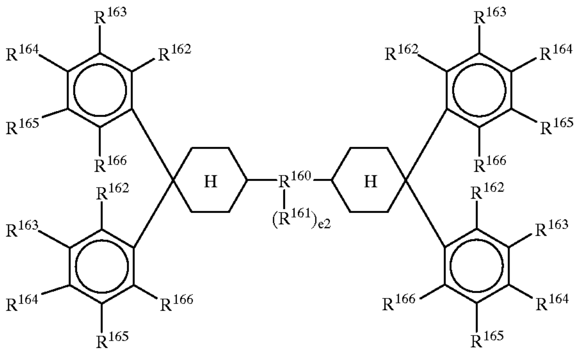

In formula (XIII), represents an organic group, a single bond, —S—, —SO—, or

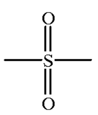

$R^{161}$ represents a hydrogen atom, a monovalent organic group, or a group represented by

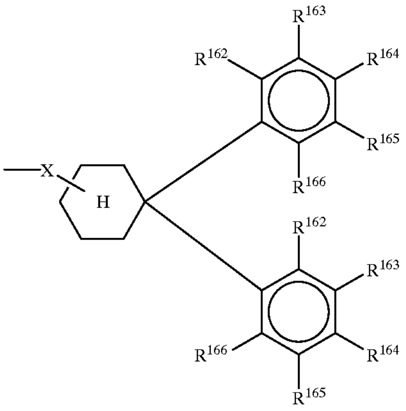

where $R^{162}$ to $R^{166}$ may be the same or different and each represents a hydrogen atom, a hydroxyl group, a halogen atom, an alkyl group, an alkoxy group, an alkenyl group, —O—$R^0$—COO—C($R^{01}$)($R^{02}$)($R^{03}$), or —O—CO—O—C($R^{01}$)($R^{02}$)($R^{03}$), provided that at least two of $R^{162}$ to $R^{166}$ are —O—$R^0$—COO—C($R^0$)($R^{02}$)($R^{03}$) or —O—CO—O—C($R^{01}$)($R^{02}$)($R^{03}$), and that the four or six substituents represented by the same symbol need not be the same, and X represents a divalent organic group; and e2 represents 0 or 1.

(XIV)

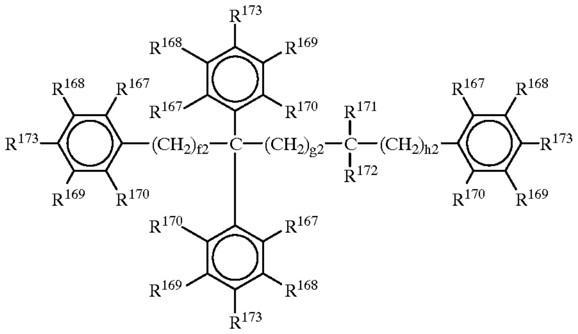

In formula (XIV), $R^{167}$ to $R^{170}$ may be the same or different and each represents a hydrogen atom, a hydroxyl group, a halogen atom, an alkyl group, an alkoxy group, or an alkenyl group, provided that the four to six substituents represented by the same symbol need not be the same;

$R^{171}$ and $R^{172}$ each represents a hydrogen atom, an alkyl group, or a group represented by

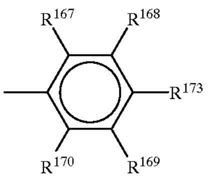

at least two of $R^{173}$ s each represents —O—$R^0$—COO—C($R^{01}$)($R^{02}$)($R^{03}$) or —O—CO—O—C($R^{01}$)($R^{02}$)($R^{03}$), and the remainder each represents a hydroxyl group;

f2 and h2 each represents 0 or 1; and g2 represents 0 or an integer of 1 to 4.

(XV)

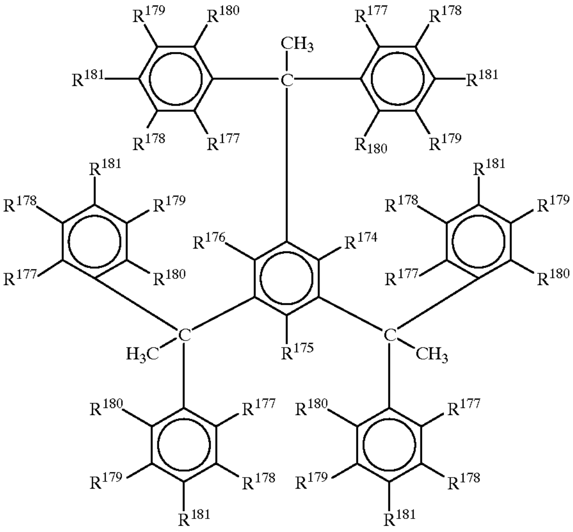

In formula (XV), $R^{174}$ to $R^{180}$ may be the same or different and each represents a hydrogen atom, a hydroxyl group, a halogen atom, an alkyl group, an alkoxy group, a nitro group, an alkenyl group, an aryl group, an aralkyl group, an alkoxycarbonyl group, an arylcarbonyl group, an acyloxy group, an acyl group, an aralkyloxy group, or an aryloxy group, provided that the six substituents represented by the same symbol need not be the same; and at least two of $R^{181}$'s each represents —O—$R^0$—COO—C($R^{01}$)($R^{02}$)($R^{03}$) or —O—CO—O—C($R^{01}$)($R^{02}$)($R^{03}$), and the remainder each represents a hydroxyl group.

(XVI)

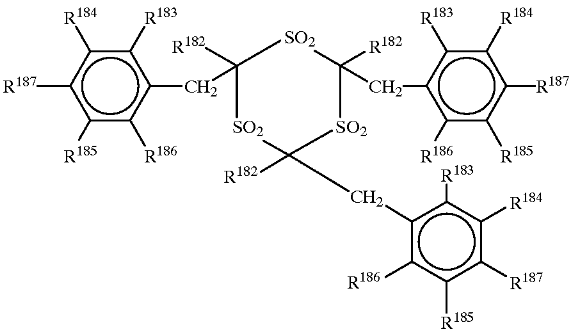

In formula (XVI), $R^{182}$ represents a hydrogen atom or an alkyl group, provided that the atoms or groups represented by $R^{182}$ need not be the same;

$R^{183}$ to $R^{186}$ each represents a hydroxyl group, a hydrogen atom, a halogen atom, an alkyl group, or an alkoxy group, provided that the three substituents represented by the same symbol need not be the same; and at least two of $R^{187}$'s each represents —O—$R^0$—COO—C($R^{01}$)($R^{02}$)($R^{03}$) or —O—CO—O—C($R^{01}$)($R^{02}$)($R^{03}$), and the remainder each represents a hydroxyl group.

Specific examples of the frameworks of preferred compounds are shown below.

(1)

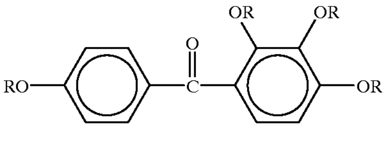

(2)

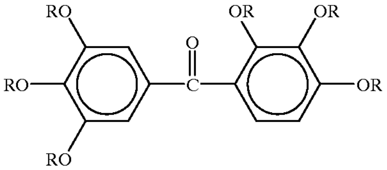

(3)

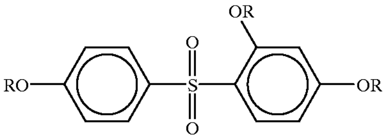

(4)

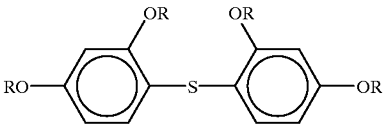

(5)

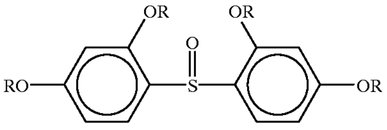

(6)

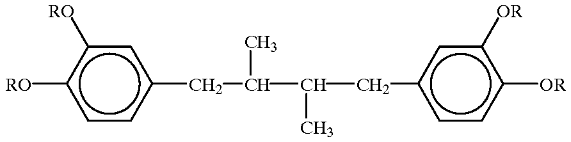

(7)

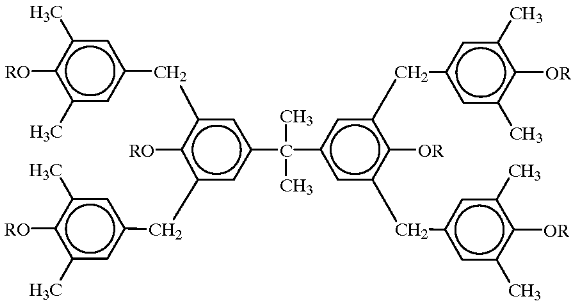

-continued
(8)
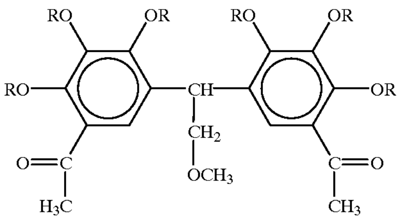
(9)
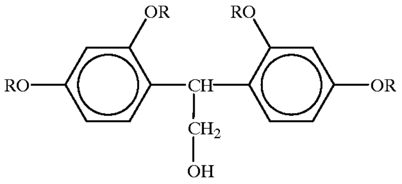
(10)
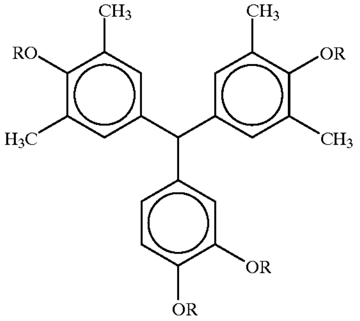
(11)
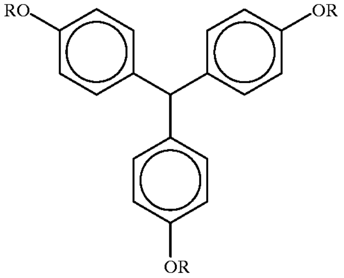
(12)
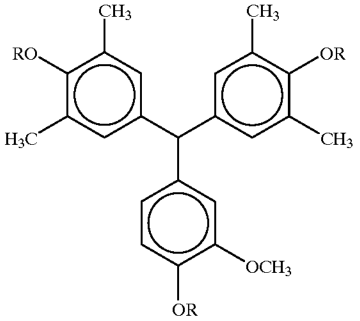
-continued
(13)
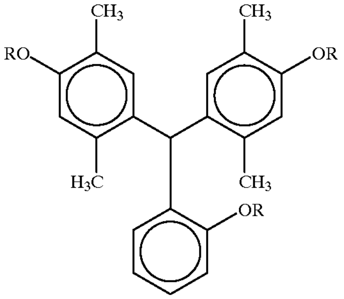
(14)
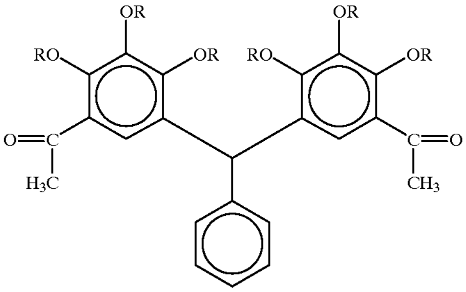
(15)
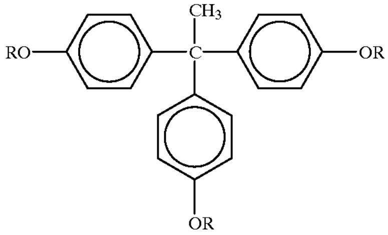
(16)
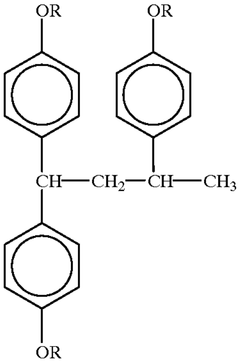
(17)
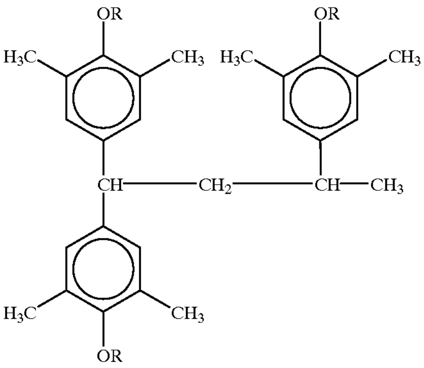

-continued
(18)
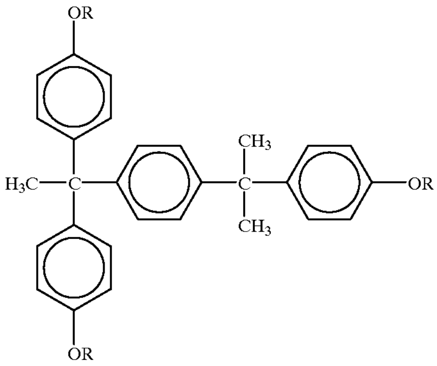
(19)
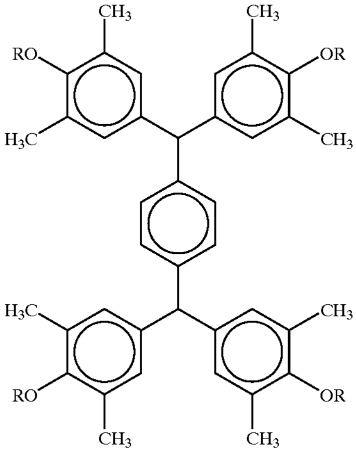
(20)
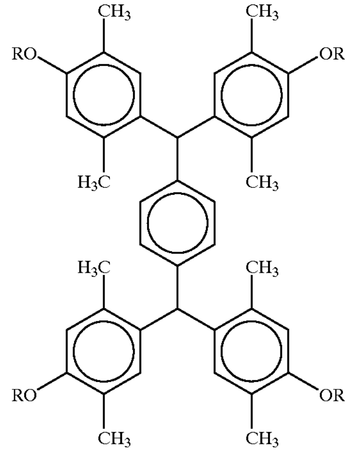
-continued
(21)
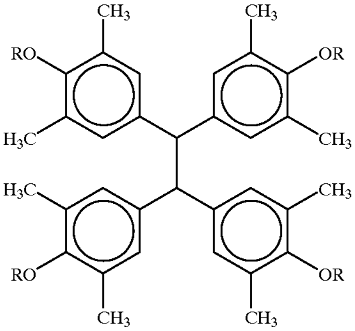
(22)
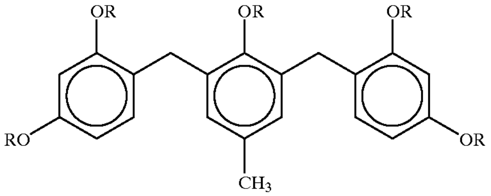
(23)
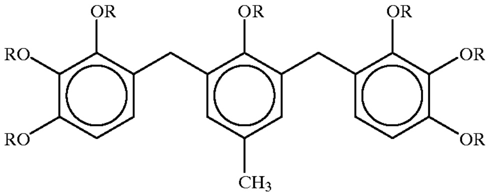
(24)
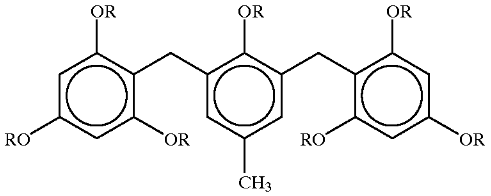
(25)
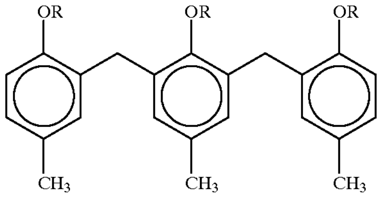
(26)
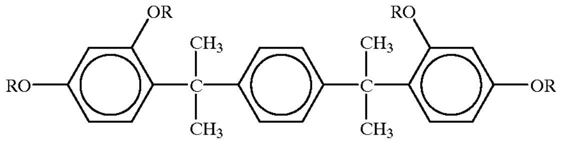
(27)
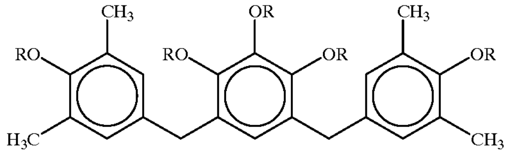

-continued
(28)
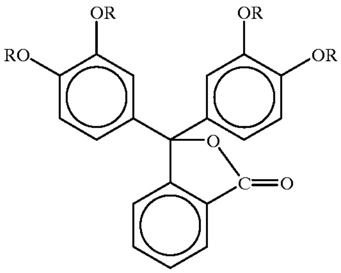
(29)
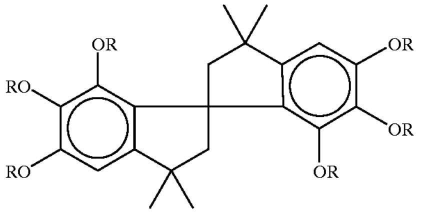
(30)
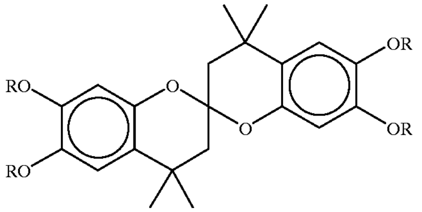
(31)
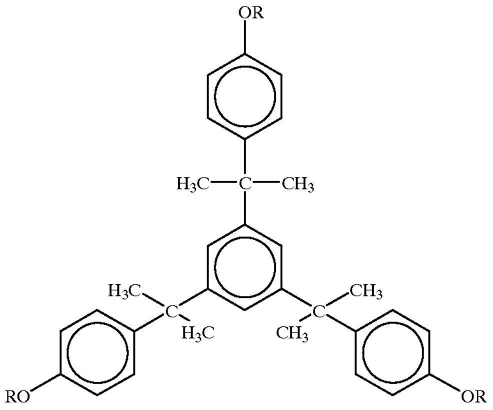
(32)
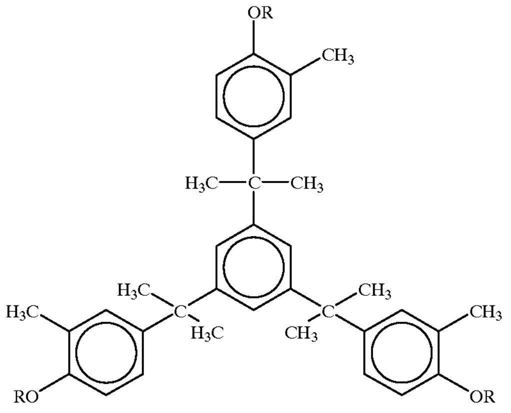
-continued
(33)
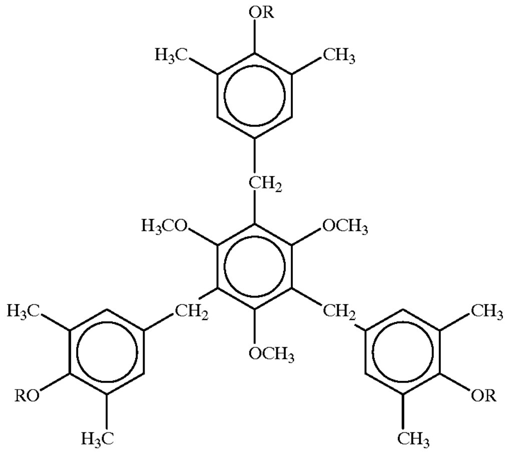
(34)
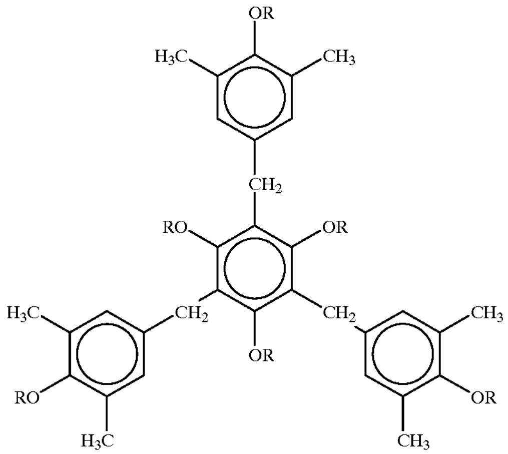
(35)
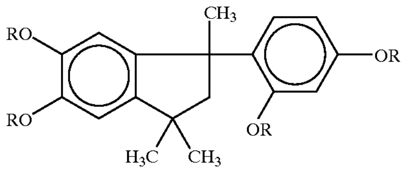
(36)
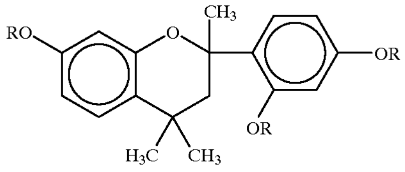
(37)
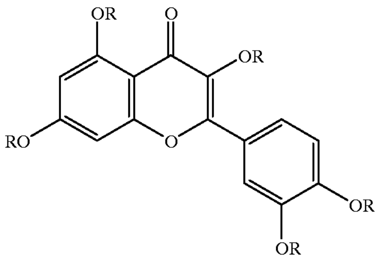

-continued
(38)
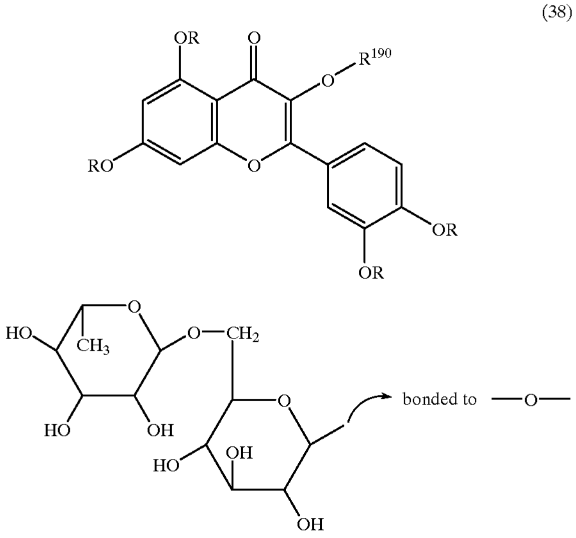
(39)
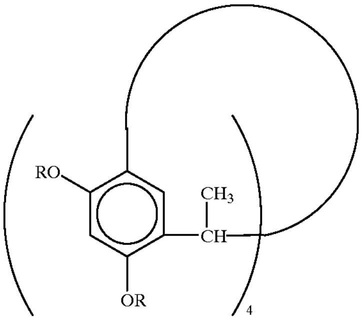
(40)
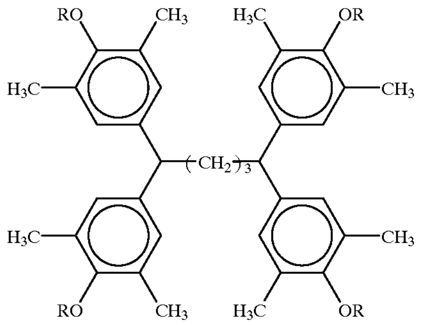
(41)
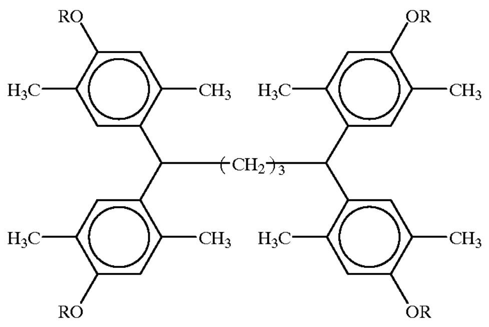
-continued
(42)
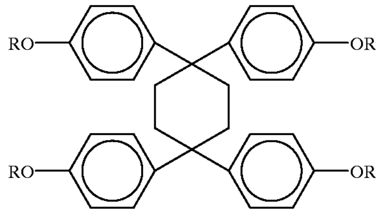
(43)
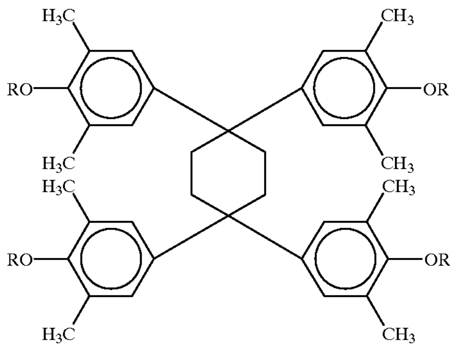
(44)
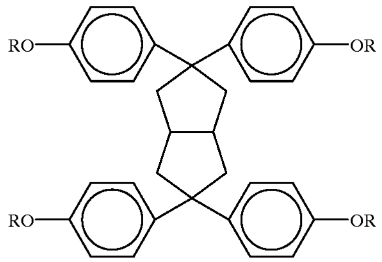
(45)
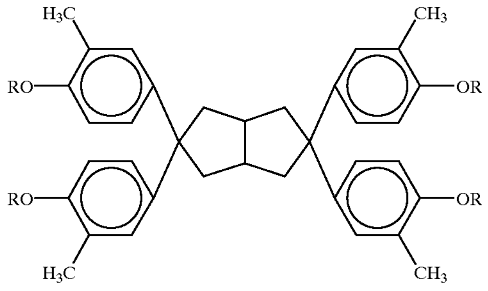
(46)
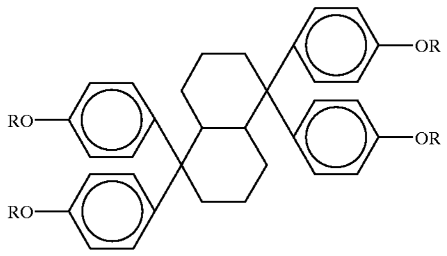

-continued
(47)
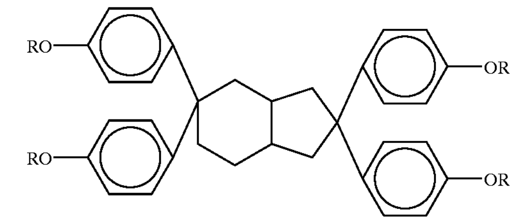
(48)
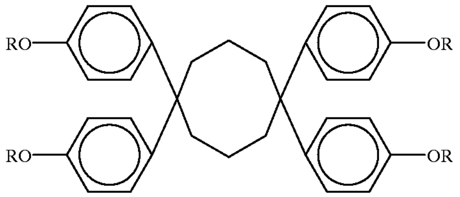
(49)
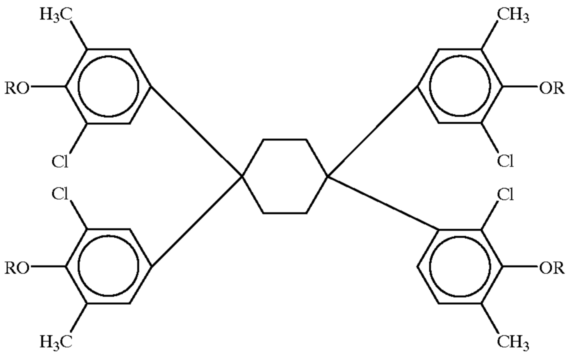
(50)
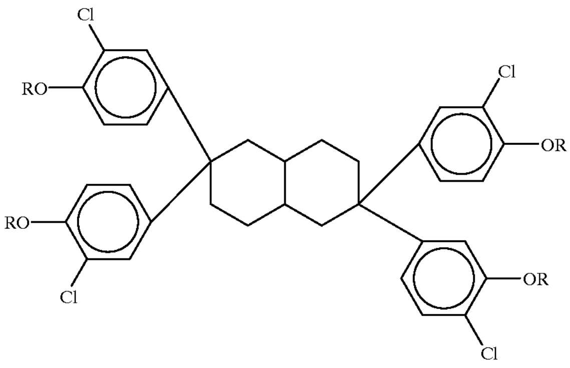
(51)
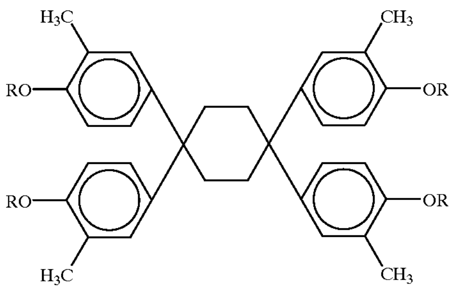
-continued
(52)
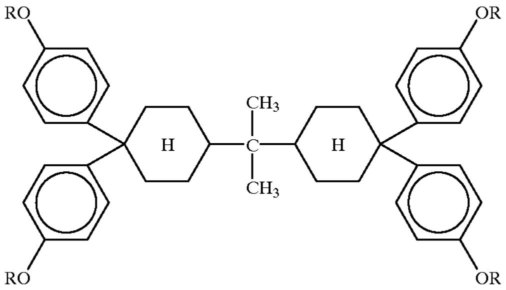
(53)
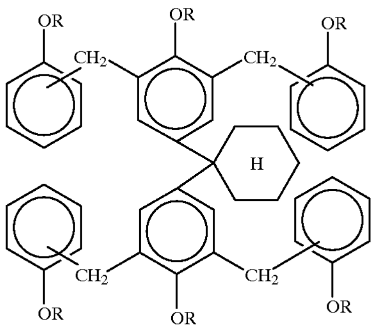
(54)
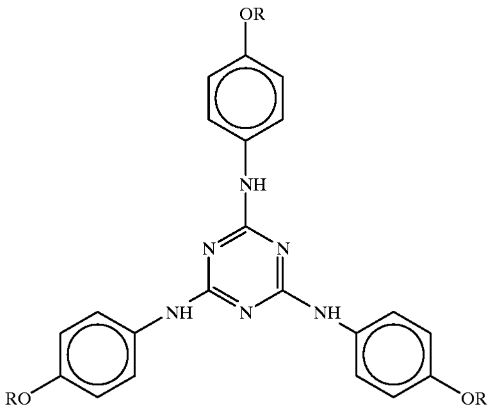
(55)
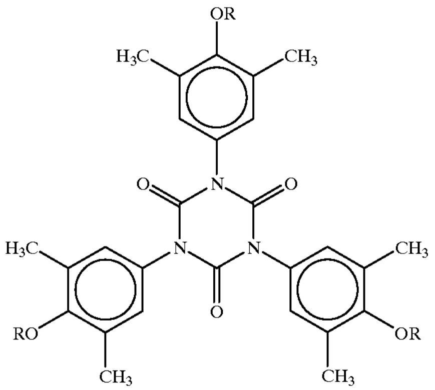

-continued
(56)
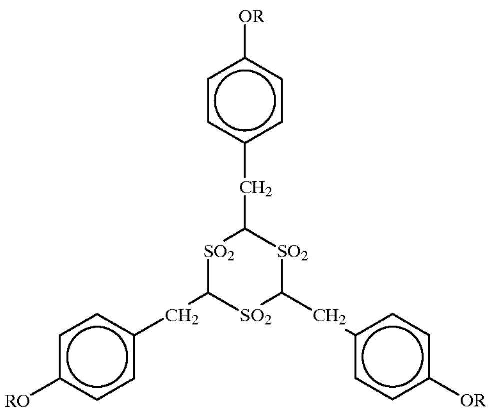
(57)
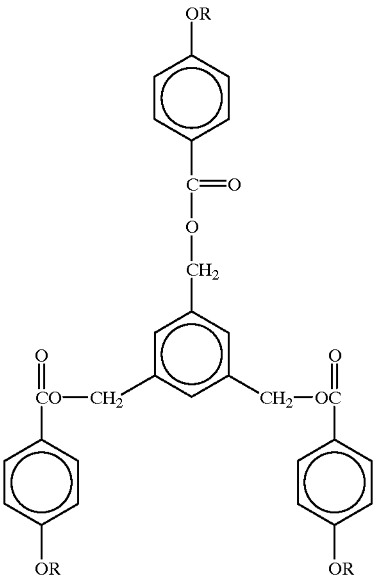
(58)
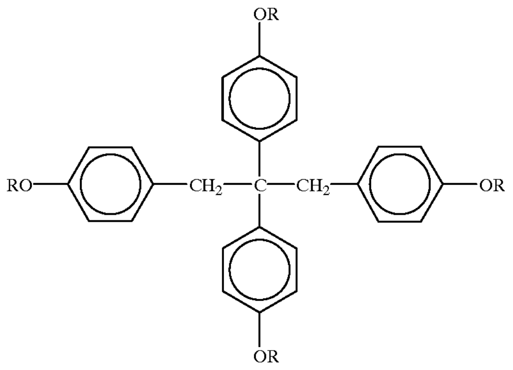
-continued
(59)
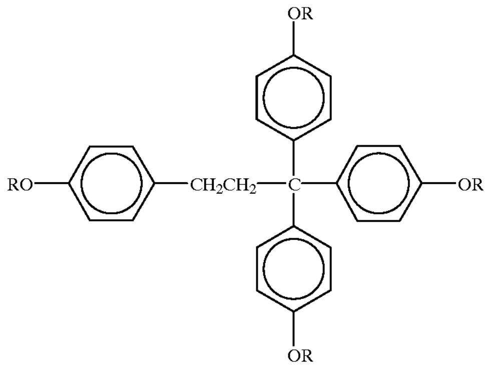
(60)
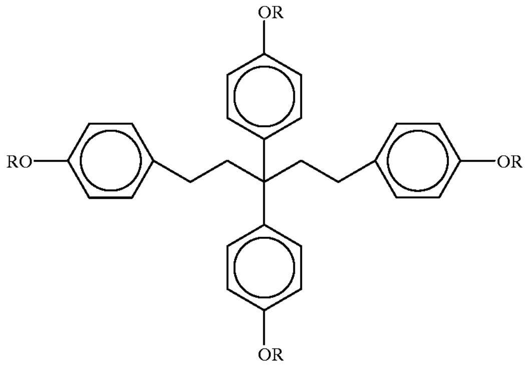
(61)
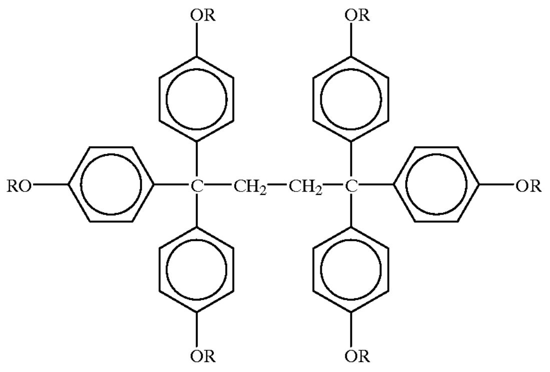
(62)
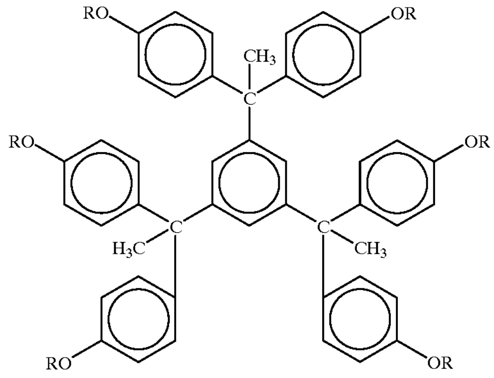

-continued (63)

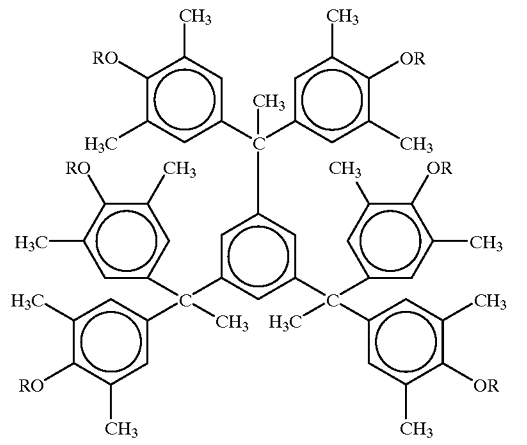

In Compounds (1) to (63), R's each represents a hydrogen atom or any of the following groups.

$-CH_2-COO-C(CH_3)_2C_6H_5$, $-CH_2-COO-C_4H_9^t$, $-COO-C_4H_9^t$,

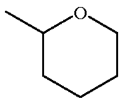

However, at least two or three, according to the structure, of the R's are not hydrogen atoms, and these substituents R's need not be the same.

The addition amount of the dissolution inhibitive compound usable in the present invention is generally from 3 to 50% by weight, preferably from 5 to 35% by weight, based on the total amount of the resist composition (excluding the solvent). If the addition amount of the dissolution inhibitive compound used in the present invention is smaller than 3% by weight, high resolution cannot be obtained. If the amount thereof is larger than 50% by weight, the composition has impaired storage stability, resulting in film shrinkage and giving a resist having impaired heat resistance.

A resin insoluble in water and soluble in aqueous alkali solutions (hereinafter referred to also as "alkali-soluble resin") may be added to the composition of the present invention.

Examples of the alkali-soluble resin for use in the present invention include novolak resins, hydrogenated novolak resins, acetone-pyrogallol resins, poly(o-hydroxystyrene), poly(m-hydroxystyrene), poly(p-hydroxystyrene), hydrogenated poly(hydroxystyrene)s, halogen- or alkyl-substituted poly(hydroxystyrene)s, hydroxystyrene/N-substituted maleimide copolymers, o/p- and m/p-hydroxystyrene copolymers, partially O-alkylated poly(hydroxystyrene)s [e.g., O-methylated, O-(1-methoxy)ethylated, O-(1-ethoxy) ethylated, O-2-tetrahydropyranylated, and O-(t-butoxycarbonyl)methylated poly(hydroxystyrene)s having a degree of substitution at the hydroxyl groups of from 5 to 30 mol %], O-acylated poly(hydroxystyrene)s [e.g., O-acetylated and O-(t-butoxy)carbonylated poly (hydroxystyrene)s having a degree of substitution at the hydroxyl groups of from 5 to 30 mol %], styrene/maleic anhydride copolymers, styrene/hydroxystyrene copolymers, α-methylstyrene/hydroxystyrene copolymers, carboxylated methacrylic resins, and derivatives thereof. However, the alkali-soluble resin for use in the present invention should not be construed as being limited to these examples.

Especially preferred alkali-soluble resins are novolak resins, poly, o-hydroxystyrene), poly(m-hydroxystyrene), poly(p-hydroxystyrene), copolymers of these hydroxystyrenes, alkyl-substituted poly(hydroxystyrene)s, partially O-alkylated or O-acylated poly(hydroxystyrene)s, styrene/hydroxystyrene copolymers, and α-methylstyrene/ hydroxystyrene copolymers. The novolak resins are obtained by addition-condensing one or more given monomers as the main ingredient with one or more aldehydes in the presence of an acid catalyst.

Examples of the given monomers include hydroxylated aromatic compounds such as phenol, cresols, i.e., m-cresol, p-cresol, and o-cresol, xylenols, e.g., 2,5-xylenol, 3,5-xylenol, 3,4-xylenol, and 2,3-xylenol, alkylphenols, e.g., m-ethylphenol, p-ethylphenol, o-ethylphenol, p-t-butylphenol, p-octylphenol, and 2,3,5-trimethylphenol, alkoxyphenols, e.g., p-methoxyphenol, m-methoxyphenol, 3,5-dimethoxyphenol, 2-methoxy-4-methylphenol, m-ethoxyphenol, p-ethoxyphenol, m-propoxyphenol, p-propoxyphenol, m-butoxyphenol, and p-butoxyphenol, dialkylphenols, e.g., 2-methyl-4-isopropylphenol, and other hydroxylated aromatics including m-chlorophenol, p-chlorophenol, o-chlorophenol, dihydroxybiphenyl, bisphenol A, phenylphenol, resorcinol, and naphthol. These compounds may be used alone or as a mixture of two or more thereof. The main monomers for novolak resins should not be construed as being limited to the above examples.

Examples of the aldehydes include formaldehyde, paraformaldehyde, acetaldehyde, propionaldehyde, benzaldehyde, phenylacetaldehyde, α-phenylpropionaldehyde, β-phenylpropionaldehyde, o-hydroxybenzaldehyde, m-hydroxybenzaldehyde, p-hydroxybenzaldehyde, O-chlorobenzaldehyde, m-chlorobenzaldehyde, p-chlorobenzaldehyde, o-nitrobenzaldehyde, m-nitrobenzaldehyde, p-nitrobenzaldehyde, o-methylbenzaldehyde, methylbenzaldehyde, p-methylbenzaldehyde, p-ethylbenzaldehyde, p-n-butylbenzaldehyde, furfural, chloroacetaldehyde, and acetals derived from these, such as chloroacetaldehyde diethyl acetal. Preferred among these is formaldehyde.

These aldehydes may be used alone or in combination of two or more thereof. Examples of the acid catalyst include hydrochloric acid, sulfuric acid, formic acid, acetic acid, and oxalic acid.

The weight-average molecular weight of the thus-obtained novolak resin is preferably from 1,000 to 30,000. If the weight-average molecular weight thereof is lower than 1,000, a considerable proportion of unexposed areas of a resist film dissolve away during development. If the weight-average molecular weight thereof exceeds 30,000, too low a developing rate results. The especially preferred range of the molecular weight of the novolak resin is from 2,000 to 20,000.

The poly(hydroxystyrene)s and derivatives and copolymers thereof shown above as alkali-soluble resins other than novolak resins each has a weight-average molecular weight of generally 2,000 or higher, preferably from 5,000 to 200,000, more preferably from 10,000 to 100,000. From the standpoint of obtaining a resist film having improved heat resistance, the weight-average molecular weight thereof is preferably 25,000 or higher.

Weight-average molecular weight herein means that determined by gel permeation chromatography and calculated for standard polystyrene.

In the present invention, those alkali-soluble resins may be used as a mixture of two or more thereof.

Besides resin (b) obtained by the specific process described above, another resin having groups which decompose by the action of an acid to enhance solubility in an alkaline developing solution can be used in the present invention.

This optionally added resin is a resin having acid-decomposable groups in the backbone and/or side chains thereof, preferably in side chains thereof.

Preferred examples of the acid-decomposable groups include groups containing a group decomposable by an acid, i.e., —COO—$A^0$ or —O—$B^0$, such as groups represented by —$R^0$—COO—$A^0$ or —Ar—O—$B^0$.

In the above formulae, $A^0$ represents —C($R^{01}$)($R^{02}$)($R^{03}$), —Si ($R^{01}$)($R^{02}$)($R^{03}$) or —C($R^{04}$)($R^{05}$)—O—$R^{06}$, and $B^0$ represents $A^0$ or —CO—O—$A^0$.

$R^{01}$, $R^{02}$, $R^{03}$, $R^{04}$, and $R^{05}$ may be the same or different and each represents a hydrogen atom, an alkyl group, a cycloalkyl group, an alkenyl group, or an aryl group, and $R^{06}$ represents an alkyl group or an aryl group, provided that at least two of $R^{01}$ to $R^{03}$ are not hydrogen atoms, and that two of $R^{01}$ to $R^{03}$ and two of $R^{04}$ to $R^{06}$ each may be bonded to each other to form a ring. $R^0$ represents an optionally substituted, aliphatic or aromatic hydrocarbon group having a valence of 2 or higher, and —Ar— represents a mono- or polycyclic, optionally substituted, aromatic group having a valence of 2 or higher. Preferred examples of the aliphatic group having a valence of 2 or higher include bivalent groups having 1 to 4 carbon atoms, such as methylene, ethylene, propylene, isopropylene, butylene, isobutylene, and t-butylene, and tri- and tetravalent groups having 1 to 4 carbon atoms, such as methine and ethyne. These groups each may have one or more substituents. Examples of the aromatic group having a valence of 2 or higher include monocyclic groups such as 1,4-phenylene, 1,3-phenylene, and 1,2-phenylene, bicyclic groups such as 1,2-naphthylene, 1,3-naphthylene, 1,4-naphthylene, 1,5-naphthylene, 1,6-naphthylene, 1,7-naphthylene, 1,8-naphthylene, 2,3-naphthylene, 2,4-naphthylene, 2,5-naphthylene, 2,6-naphthylene, 2,7-naphthylene, and 2,8-naphthylene, and tricyclic groups such as anthracene. The aromatic group may also be a fused ring made up of a larger number of rings, and may have one or more substituents.

Preferred examples of the alkyl group include those having 1 to 4 carbon atoms, such as methyl, ethyl, propyl, n-butyl, sec-butyl, and t-butyl. Preferred examples of the cycloalkyl group include those having 3 to 10 carbon atoms, such as cyclopropyl, cyclobutyl, cyclohexyl, and adamantyl. Preferred examples of the alkenyl group include those having 2 to 4 carbon atoms, such as vinyl, propenyl, allyl, and butenyl. Preferred examples of the aryl group include those having 6 to 14 carbon atoms, such as phenyl, xylyl, toluyl, cumenyl, naphthyl, and anthracenyl.

Examples of the substituents include hydroxy, halogen atoms (fluorine, chlorine, bromine, and iodine), nitro, cyano, the aforementioned alkyl groups, alkoxy groups such as methoxy, ethoxy, hydroxyethoxy, propoxy, hydroxypropoxy, n-butoxy, isobutoxy, sec-butoxy, and t-butoxy, alkoxycarbonyl groups such as methoxycarbonyl and ethoxycarbonyl, aralkyl groups such as benzyl, phenethyl, and cumyl, aralkyloxy groups, acyl groups such as formyl, acetyl, butyryl, benzoyl, cianamyl, and valeryl, acyloxy groups such as butyryloxy, the aforementioned alkenyl groups, alkenyloxy groups such as vinyloxy, propenyloxy, allyloxy, and butenyloxy, the aforementioned aryl groups, aryloxy groups such as phenoxy, and aryloxycarbonyl groups such as benzoyloxy.

Preferred acid-decomposable groups are silyl ether groups, cumyl ester groups, acetal groups, ketal groups, tetrahydropyranyl ether groups, enol ether groups, enol ester groups, tertiary alkyl ether groups, tertiary alkyl ester groups, tertiary alkyl carbonate groups, and the like. More preferred are tertiary alkyl ester groups, tertiary alkyl carbonate groups, cumyl ester groups, tetrahydropyranyl ether groups, and acetal groups.

The most preferred among these are acetal groups and ketal groups.

In the case where these acid-decomposable groups are bonded as side chains to a resin, this base resin is an alkali-soluble resin having —OH or —COOH groups, preferably —$R^0$—COOH or —Ar—OH groups, as side chains. Examples of this alkali-soluble resin include the aforementioned alkali-soluble resins.

These alkali-soluble resins have an alkali dissolution rate of preferably 170 Å/sec or higher, more preferably 330 Å/sec or higher, as measured in 0.261 N tetramethylammonium hydroxide (TMAH) at 23° C.

Preferred from the standpoint of attaining a rectangular profile is an alkali-soluble resin having a high far-ultraviolet or excimer laser beam transmittance. Specifically, a 1 m-thick film of the resin preferably has a transmittance at 248 nm of from 20 to 80%.

Especially preferred alkali-soluble resins from the above standpoint are poly(o-, m-, or p-hydroxystyrene), copolymers thereof, hydrogenated poly(hydroxystyrene)s, halogen- or alkyl-substituted poly(hydroxystyrene)s, partially O-alkylated or O-acylated poly(hydroxystyrene)s, styrene/hydroxystyrene copolymers, α-methylstyrene/hydroxystyrene copolymers, and hydrogenated novolak resins.

The resin having acid-decomposable groups which can be optionally used in the present invention can be obtained by reacting an alkali-soluble resin with a precursor for acid-decomposable groups or by copolymerizing a monomer for an alkali-soluble resin which monomer has an acid-decomposable group with any of various monomers, as disclosed in, e.g., European Patent 254,853, JP-A-2-25850, JP-A-3-223860, and JP-A-4-251259.

A preferred example of the resin having acid-decomposable groups which is optionally usable in the present invention is one in which from 15 to 35 mol % of the OH groups of the base resin have been protected with acetal or ketal groups. This resin shows satisfactory compatibility with components of the present invention.

Specific examples of the resins having acid-decomposable groups for use in the present invention, including resin (b) and the optionally usable resin both described above, are given below. However, the present invention should not be construed as being limited by these examples.

(i)

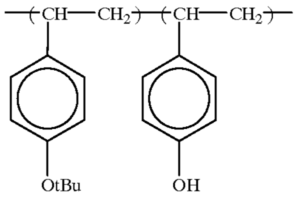

-continued
(ii)
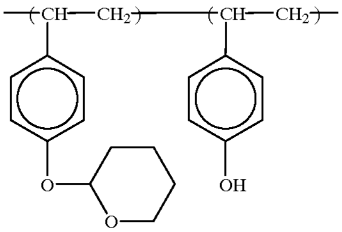
(iii)
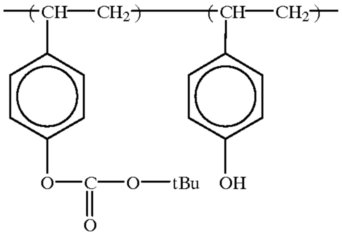
(iv)
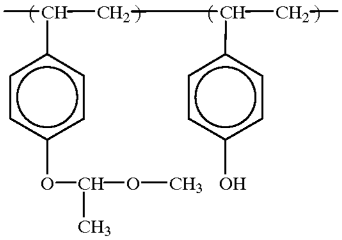
(v)
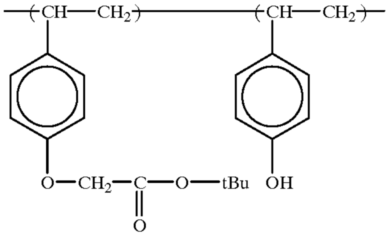
(vi)
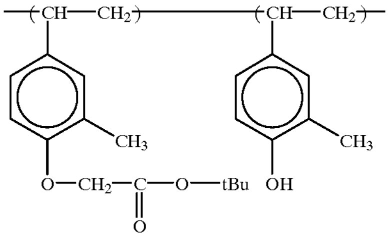
(vii)
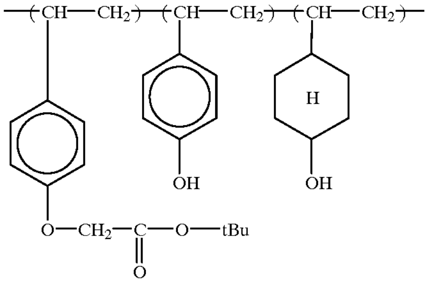
-continued
(viii)
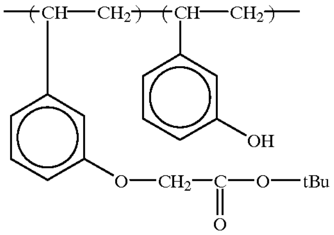
(ix)
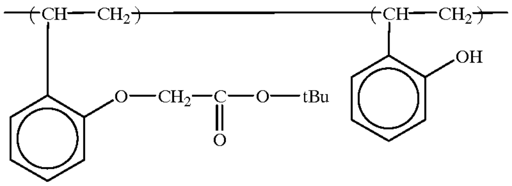
(x)
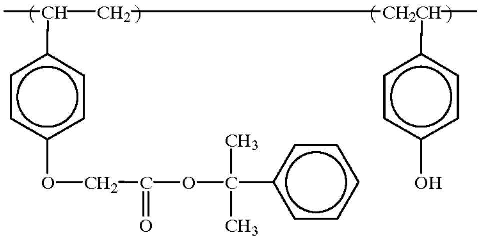
(xi)
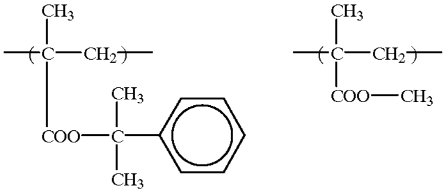
(xii)
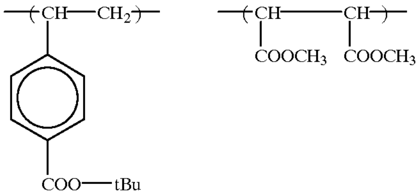
(xiii)
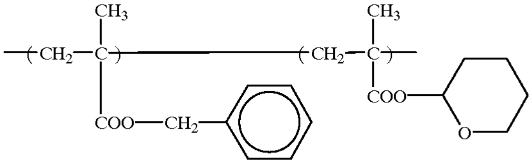

-continued
(xiv)
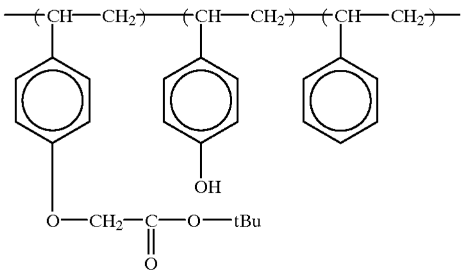
(xv)
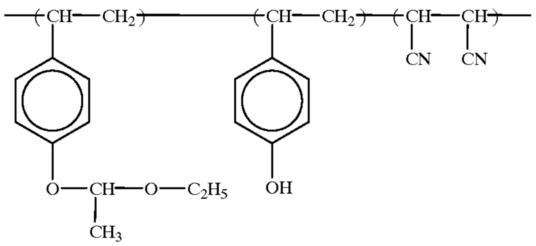
(xvi)
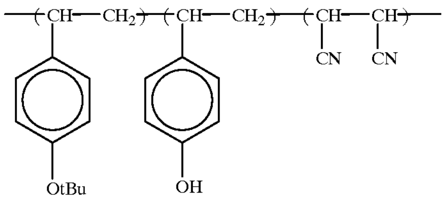
(xvii)
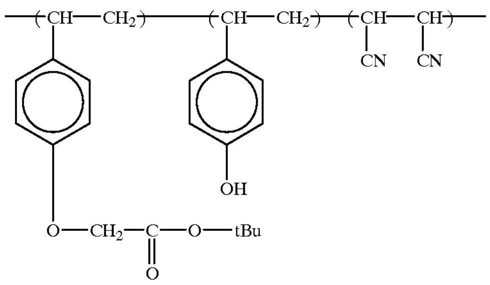
(xviii)
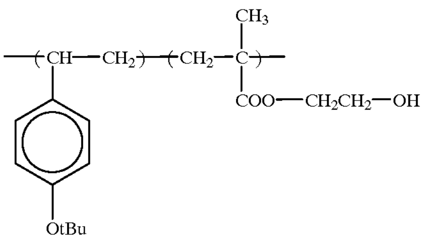
-continued
(xix)
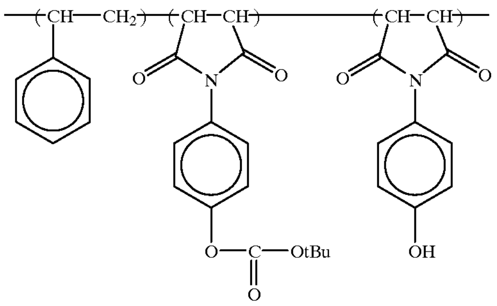
(xx)
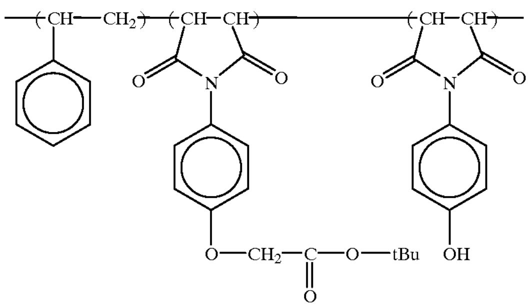
(xxi)
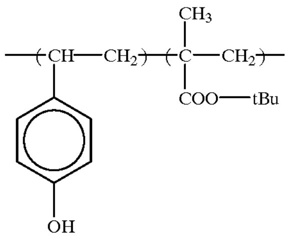
(xxii)
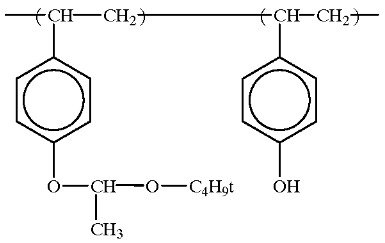
(xxiii)
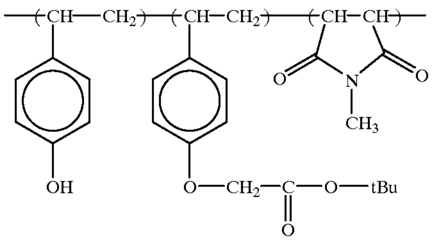
(xxiv)
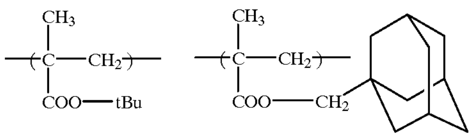

-continued
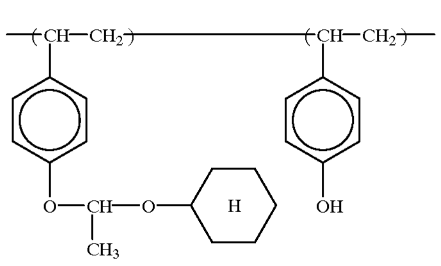
(xxv)
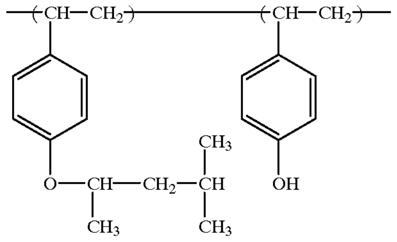
(xxvi)
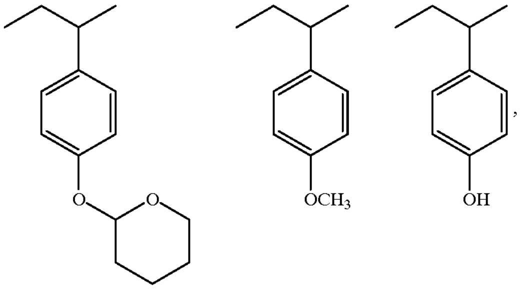
1
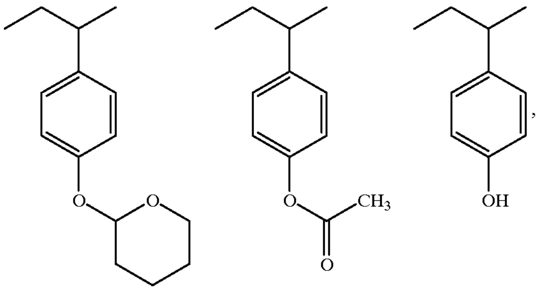
2
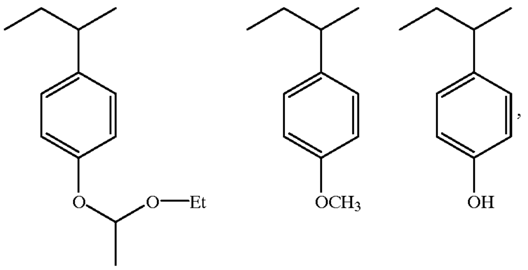
3
-continued
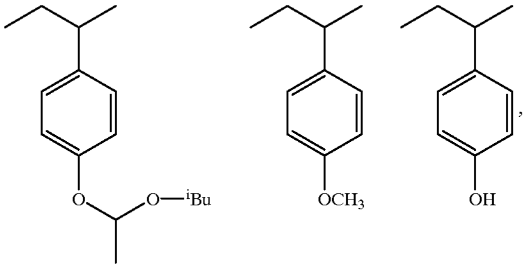
4
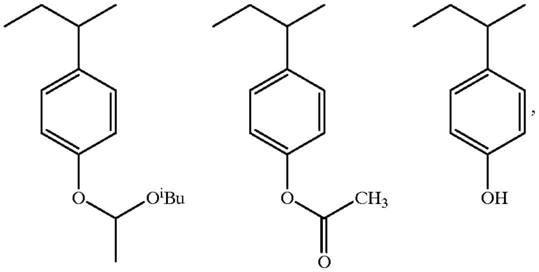
5
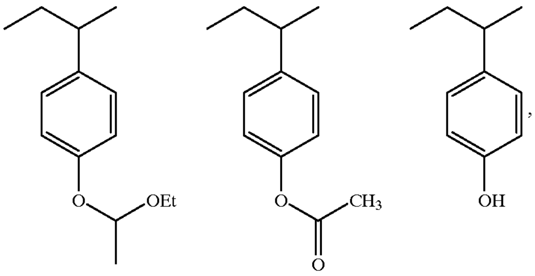
6
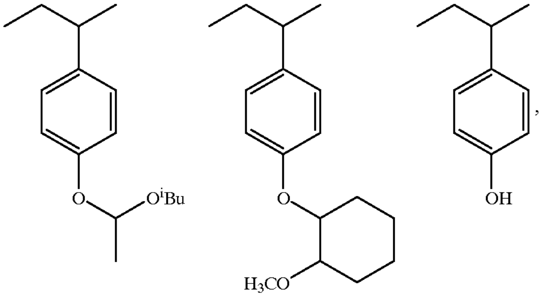
7
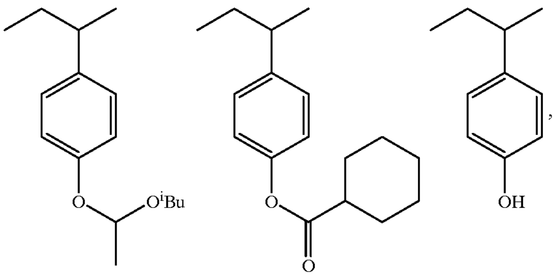
8

-continued
9
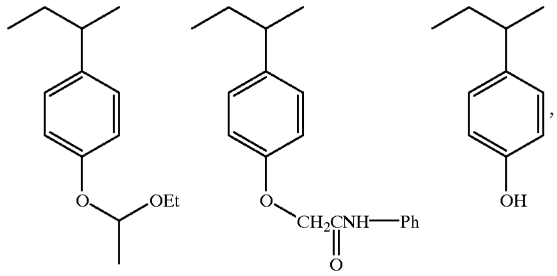
10
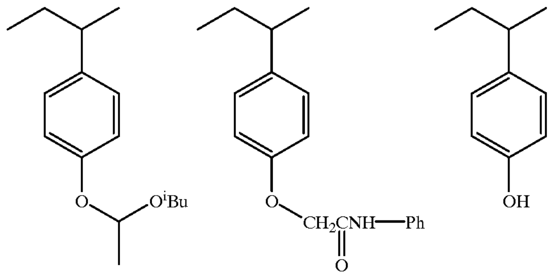
11
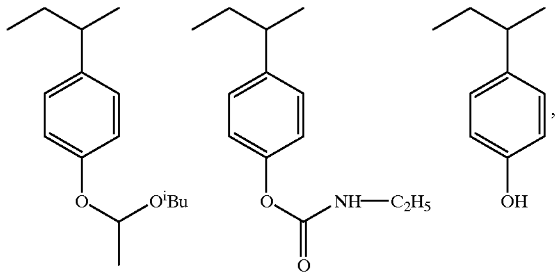
12
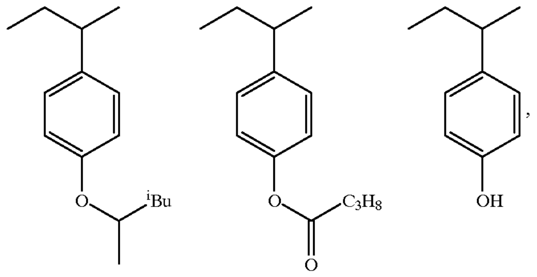
13
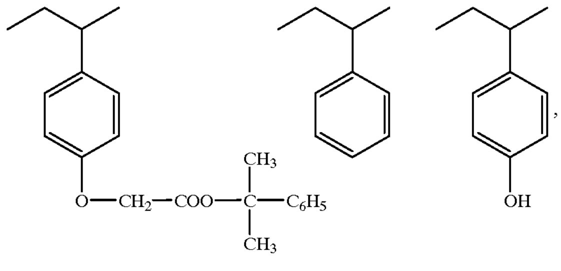
-continued
14
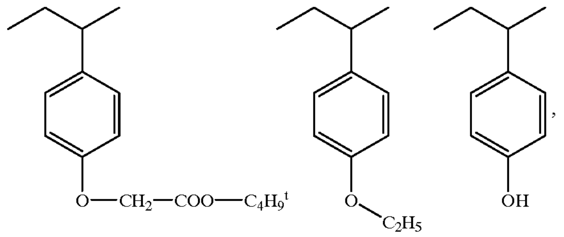
15
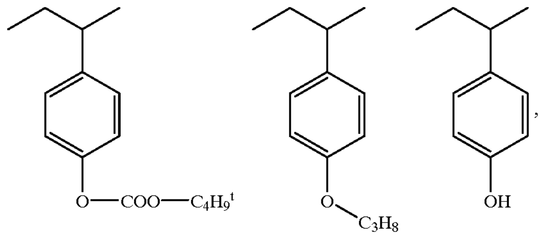
16
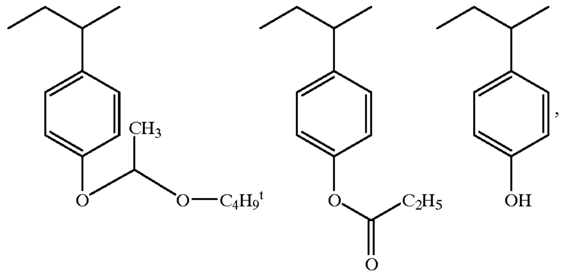
17
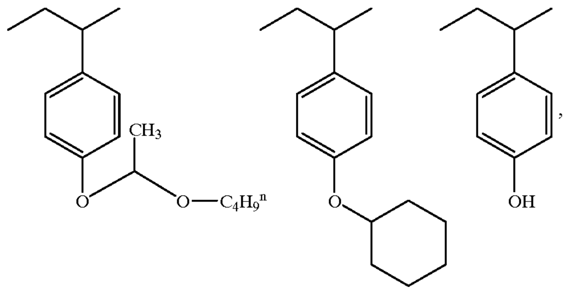
18
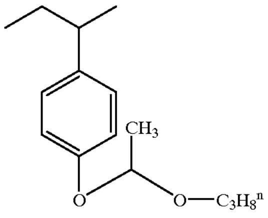

-continued
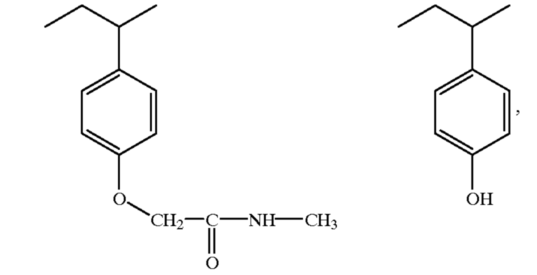
19
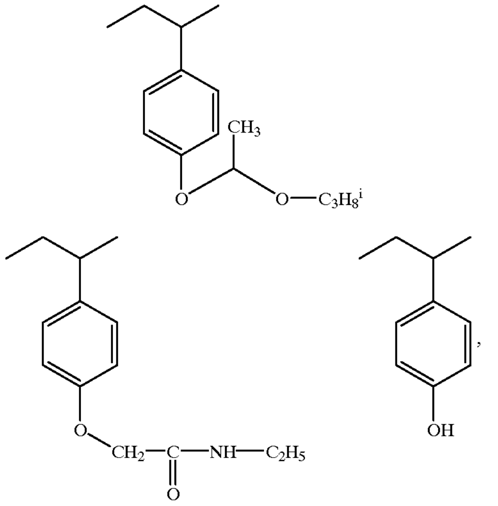
20
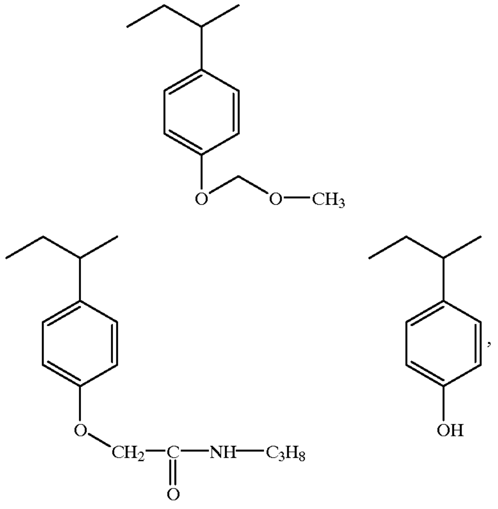
21
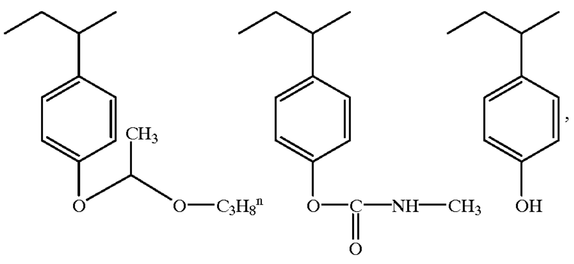
-continued
22
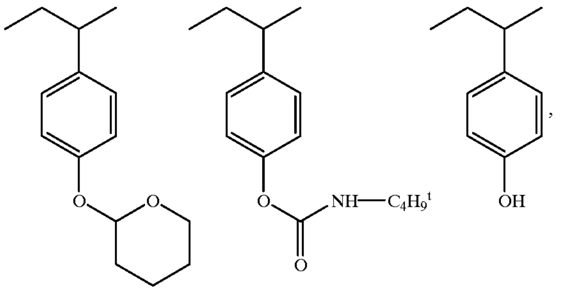
23
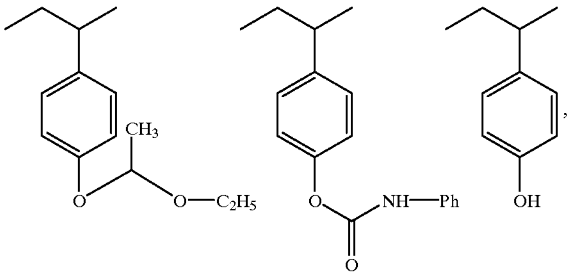
24
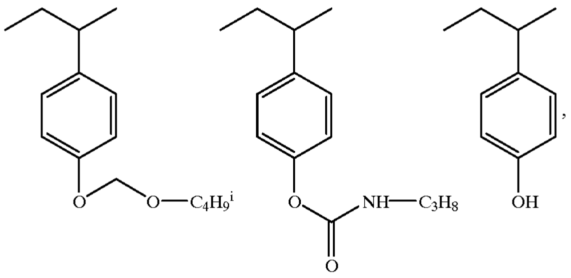
25
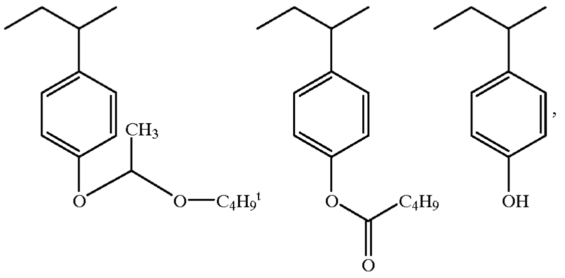
26
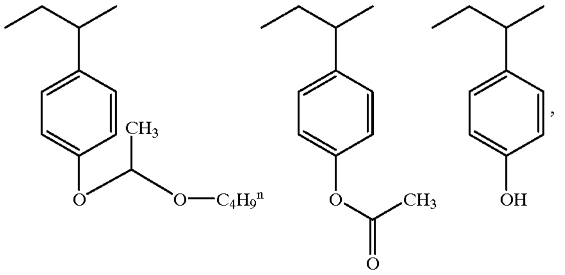

-continued
27
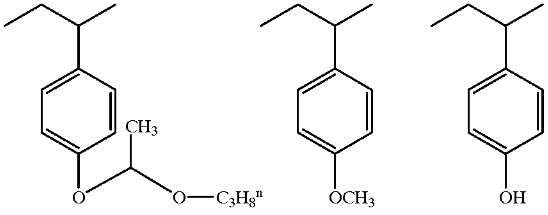
,
28
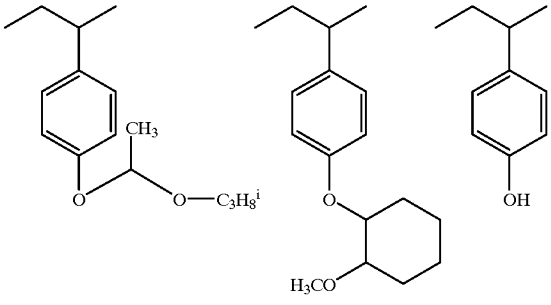
,
29
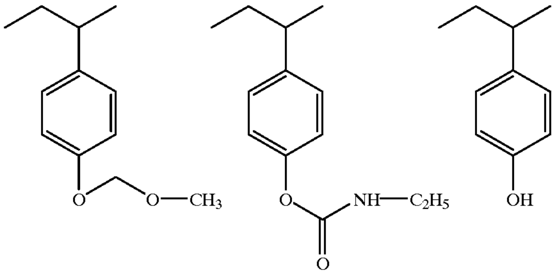
,
30
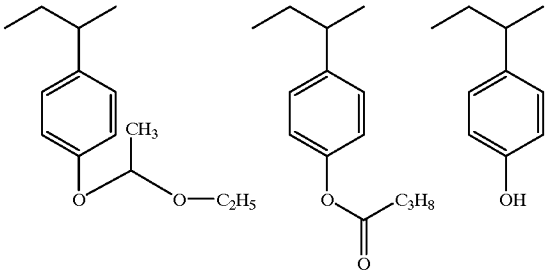
,
31
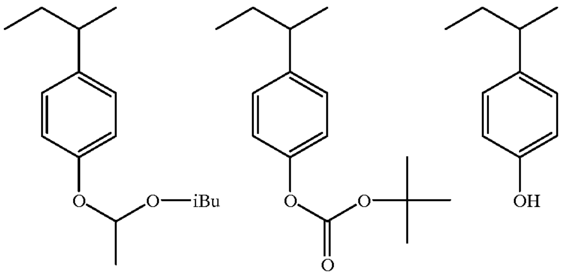
-continued
32
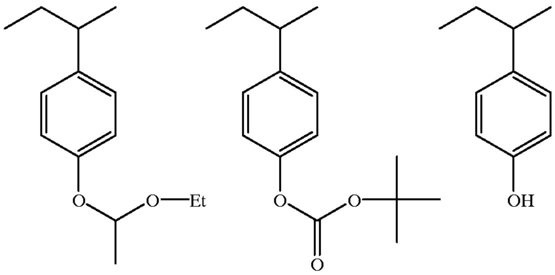
33
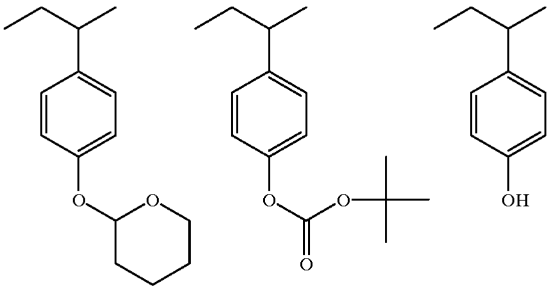
34
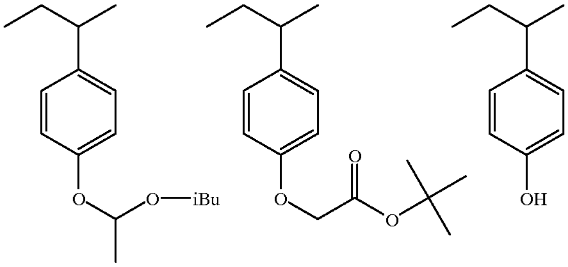
35
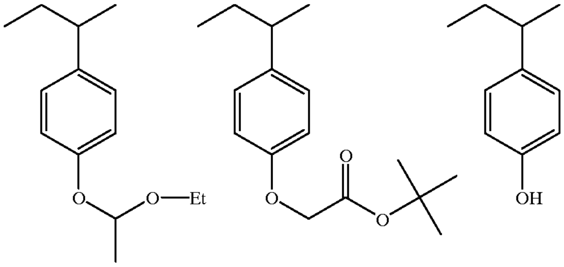
36
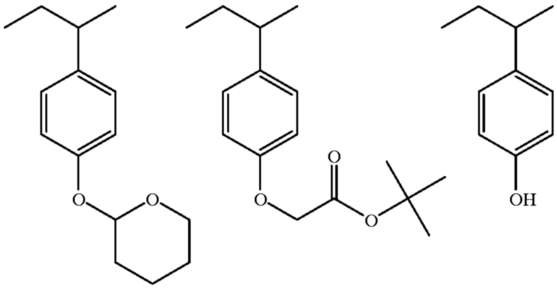

The content of acid-decomposable groups in a resin is expressed in terms of B/(B+S), wherein B is the number of the acid-decomposable groups in the resin and S is the number of alkali-soluble groups not protected by the acid-decomposable groups. The content thereof is preferably from 0.01 to 0.5, more preferably from 0.05 to 0.40, most preferably from 0.05 to 0.30. Values of B/(B+S) larger than 0.5 are undesirable in that such a resin suffers film shrinkage after post-exposure bake, has insufficient adhesion to substrates, and causes a scum. On the other hand, values of B/(B+S) smaller than 0.01 are undesirable in that use of such a resin may result in a resist pattern having an extreme standing wave mark in the side walls thereof.

The weight-average molecular weight ($M_w$) of each resin having acid-decomposable groups is desirably from 2,000 to 200,000. If the $M_w$ thereof is lower than 2,000, a considerable proportion of unexposed parts of a resist film dissolve away during development. If the $M_w$ thereof exceeds 200,000, the alkali-soluble resin itself has too low a rate of dissolution in an alkali, resulting in reduced sensitivity. The preferred range of the Mw of the resin is from 5,000 to 100,000, especially from 8,000 to 50,000.

Weight-average molecular weight herein means that determined by gel permeation chromatography and calculated for standard polystyrene.

The resin having acid-decomposable groups which can be optionally used in the present invention may be a mixture of two or more polymers each having acid-decomposable groups. The use amount of this resin optionally usable in the present invention is preferably up to 100 parts by weight, more preferably up to 75 parts by weight, per 100 parts by weight of resin (b).

An organic basic compound can be used in the composition of the present invention. Use of this compound is preferred in that it serves to improve storage stability and reduce the change in line width during PED.

Preferred organic basic compounds usable in the present invention are compounds which are more strongly basic than phenol. Especially preferred among these are nitrogen-containing basic compounds.

Preferred chemical environments include structures represented by the following formulae (A) to (E).

(A)

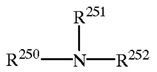

In formula (A), $R^{250}$, $R^{251}$, and $R^{252}$ may be the same or different and each represents a hydrogen atom, an alkyl group having 1 to 6 carbon atoms, an aminoalkyl group having 1 to 6 carbon atoms, a hydroxyalkyl group having 1 to 6 carbon atoms, or a substituted or unsubstituted aryl group having 6 to 20 carbon atoms, provided that $R^{254}$ and $R^{255}$ may be bonded to each other to form a ring.

(B)

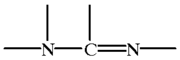

(C)

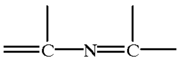

-continued (D)

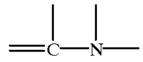

(E)

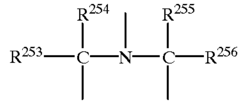

(In formula (E), $R^{253}$, $R^{254}$, $R^{255}$, and $R^{256}$ may be the same or different and each represents an alkyl group having 1 to 6 carbon atoms.)

More preferred organic basic compounds are nitrogen-containing basic compounds having, per molecule, two or more nitrogen atoms having different chemical environments. Most preferred are compounds containing both at least one substituted or unsubstituted amino group and at least one nitrogen-containing ring structure and compounds having at least one alkylamino group. Preferred examples of such compounds include substituted or unsubstituted guanidine, substituted or unsubstituted aminopyridine, substituted or unsubstituted aminoalkylpyridines, substituted or unsubstituted aminopyrrolidine, substituted or unsubstituted imidazole, substituted or unsubstituted pyrazole, substituted or unsubstituted pyrazine, substituted or unsubstituted pyrimidine, substituted or unsubstituted purine, substituted or unsubstituted imidazoline, substituted or unsubstituted pyrazoline, substituted or unsubstituted piperazine, substituted or unsubstituted aminomorpholine, and substituted or unsubstituted aminoalkylmorpholines. Preferred substituents include amino, aminoalkyl groups, alkylamino groups, aminoaryl groups, arylamino groups, alkyl groups, alkoxy groups, acyl groups, acyloxy groups, aryl groups, aryloxy groups, nitro, hydroxy, and cyano. Specific examples of the most preferred organic basic compounds include guanidine, 1,1-dimethylguanidine, 1,1,3,3-tetramethylguanidine, 2-aminopyridine, 3-aminopyridine, 4-aminopyridine, 2-dimethylaminopyridine, 4-dimethylaminopyridine, 2-diethylaminopyridine, 2-(aminomethyl)pyridine, 2-amino-3-methylpyridine, 2-amino-4-methylpyridine, 2-amino-5-methylpyridine, 2-amino-6-methylpyridine, 3-aminoethylpyridine, 4-aminoethylpyridine, 3-aminopyrrolidine, piperazine, N-(2-aminoethyl)piperazine, N-(2-aminoethyl)piperidine, 4-amino-2,2,6,6-tetramethylpiperidine, 4-piperidinopiperidine, 2-iminopiperidine, 1-(2-aminoethyl)pyrrolidine, pyrazole, 3-amino-5-methylpyrazole, 5-amino-3-methyl-1-p-tolylpyrazole, pyrazine, 2-(aminomethyl)-5-methylpyrazine, pyrimidine, 2,4-diaminopyrimidine, 4,6-dihydroxypyrimidine, 2-pyrazoline, 3-pyrazoline, N-aminomorpholine, and N-(2-aminoethyl)morpholine. However, the organic basic compounds usable in the present invention should not be construed as being limited to these examples.

Those nitrogen-containing basic compounds may be used alone or in combination of two or more thereof. The use amount of the nitrogen-containing basic compounds is usually from 0.001 to 10 parts by weight, preferably from 0.01 to 5 parts by weight, per 100 parts by weight of the photosensitive resin composition (excluding the solvent). If the amount thereof is smaller than 0.001 part by weight, the aforementioned effects cannot be obtained. On the other hand, amounts thereof exceeding 10 parts by weight tend to result in reduced sensitivity and impaired development resistance of unexposed areas.

The chemical amplification type positive resist composition of the present invention may optionally further contain other ingredients such as, e.g., surfactants, dyes, pigments, plasticizers, photosensitizers, and compounds having two or more phenolic OH groups and accelerating dissolution in a developing solution.

Preferred examples of the surfactants include nonionic surfactants such as polyoxyethylene alkyl ethers, e.g., polyoxyethylene lauryl ether, polyoxyethylene stearyl ether, polyoxyethylene cetyl ether, and polyoxyethylene oleyl ether, polyoxyethylene alkylaryl ethers, e.g., polyoxyethylene octylphenol ether and polyoxyethylene nonylphenol ether, polyoxyethylene/polyoxypropylene block copolymers, sorbitan/fatty acid esters, e.g., sorbitan monolaurate, sorbitan monopalmitate, sorbitan monostearate, sorbitan monooleate, sorbitan trioleate, and sorbitan tristearate, and polyoxyethylene-sorbitan/fatty acid esters, e.g., polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorochemical surfactants such as F-Top EF301, EF303, and EF352 (manufactured by New Akita Chemical Company), Megafac F171 and F173 (manufactured by Dainippon Ink & Chemicals, Inc.), Fluorad FC430 and FC431 (manufactured by Sumitomo 3M Ltd.), Asahi Guard AG710 and Surflon S-382, SC101, SC102, SC103, SC104, SC105, and SC106 (manufactured by Asahi Glass Co., Ltd.); organosiloxane polymer KP341 (manufactured by Shin-Etsu Chemical Co., Ltd., Japan); and acrylic or methacrylic (co)polymers Polyflow No. 75 and No. 95 (manufactured by Kyoeisha Chemical Co., Ltd.

These surfactants may be added alone or in combination of two or more thereof. The addition amount thereof is preferably from 0.0005 to 0.01 part by weight per 100 parts by weight of the composition (excluding the solvent).

Preferred examples of the dyes include oil-soluble dyes and basic dyes. Specific examples thereof include Oil Yellow #101, Oil Yellow #103, Oil Pink #312, Oil Green BG, Oil Blue BOS, Oil Blue #603, Oil Black BY, Oil Black BS, Oil Black T-505 (all manufactured by Orient Chemical Industries Ltd.), crystal violet (CI 42555), methyl violet (CI 42535), rhodamine B (CI 45170B), malachite green (CI 42000), and methylene blue (CI 52015).

Spectral sensitizers such as those given below may be further added to sensitize the photo-acid generator used so as to show absorption in a region of longer wavelengths than far ultraviolet, whereby the chemical amplification type positive resist of the present invention can be rendered sensitive to an i- or g-line. Preferred examples of such spectral sensitizers include benzophenone, p,p'-tetramethyldiaminobenzophenone, p,p'-tetraethylethylamino-benzophenone, 2-chlorothioxanthone, anthrone, 9-ethoxyanthracene, anthracene, pyrene, perylene, phenothiazine, benzil, acridine orange, benzoflavin, cetoflavin T, 9,10-diphenylanthracene, 9-fluorenone, acetophenone, phenanthrene, 2-nitrofluorene, 5-nitroacenaphthene, benzoquinone, 2-chloro-4-nitroaniline, N-acetyl-p-nitroaniline, p-nitroaniline, N-acetyl-4-nitro-1-naphthylamine, picramide, anthraquinone, 2-ethylanthraquinone, 2-tert-butylanthraquinone, 1,2-benzanthraquinone, 3-methyl-1,3-diaza-1,9-benzanthrone, dibenzalacetone, 1,2-naphthoquinone, 3,31-carbonylbis(5,7-dimethoxycarbonylcoumarin), and coronene. However, the spectral sensitizers usable in the present invention should not be construed as being limited to these examples.

Examples of the compounds having two or more phenolic OH groups and accelerating dissolution in a developing solution include polyhydroxy compounds. Preferred examples of the polyhydroxy compounds include phenols, resorcinol, phloroglucinol, phloroglucide, 2,3,4-trihydroxybenzophenone, 2,3,4,4'-tetrahydroxybenzophenone, α,α',α"-tris(4-hydroxyphenyl)-1,3,5-triisopropylbenzene, tris(4-hydroxyphenyl)methane, tris(4-hydroxyphenyl)ethane, and 1,1'-bis(4-hydroxyphenyl)cyclohexane.

A satisfactory resist pattern can be obtained by applying the chemical amplification type positive resist composition described above on a substrate such as those for use in the production of precision integrated-circuit elements (e.g., silicon/silicon dioxide coating) by an appropriate coating means, e.g., a spinner or coater, exposing the coating to light through a given mask, and then baking and developing the coating.

As a developing solution for the photosensitive composition of the present invention, use can be made of an alkaline aqueous solution of an inorganic alkali, e.g., sodium hydroxide, potassium hydroxide, sodium carbonate, sodium silicate, sodium metasilicate, or ammonia water, a primary amine, e.g., ethylamine or n-propylamine, a secondary amine, e.g., diethylamine or di-n-butylamine, a tertiary amine, e.g., triethylamine or methyldiethylamine, an alcoholamine, e.g., dimethylethanolamine or triethanolamine, a quaternary ammonium salt, e.g., tetramethylammonium hydroxide or tetraethylammonium hydroxide, a cyclic amine, e.g., pyrrole or piperidine, or the like.

The alkaline aqueous solution for use as a developing solution may contain an appropriate amount of an alcohol and a surfactant.

The present invention will be explained below in more detail by reference to Examples, but the scope of the invention should not be construed as being limited thereby.

RESIN SYNTHESIS EXAMPLE 1 (PHS/iBES)

In 1,800 ml of propylene glycol monomethyl ether acetate was dissolved 360 g of poly(p-hydroxystyrene) (weight-average molecular weight, 11,000). This solution was subjected to vacuum distillation. After the solution was ascertained to have a sufficiently low water content, 126.0 g of isobutyl vinyl ether and 0.1 g of p-toluenesulfonic acid were added thereto. This mixture was stirred at room temperature for 2 hours.

To the reaction mixture was added 0.2 g of triethylamine, followed by 300 ml of water and 300 ml of ethyl acetate to conduct water washing extraction. This operation was conducted three times. The aqueous layer was removed, and the remaining organic layer was distilled under vacuum to remove the residual water and ethyl acetate.

The resin solution obtained had a solid concentration of 25%. Thus, a p-hydroxystyrene/p-(isobutoxyethoxy)styrene, copolymer (70/30)(weight-average molecular weight, 12,000) was obtained.

RESIN SYNTHESIS EXAMPLE 2 (PHS/iBES/AcS)

In 1,800 ml of propylene glycol monomethyl ether acetate was dissolved 360 g of poly(p-hydroxystyrene) (weight-average molecular weight, 11,000). This solution was subjected to vacuum distillation. After the solution was ascertained to have a sufficiently low water content, 84.0 g of isobutyl vinyl ether and 0.1 g of p-toluenesulfonic acid were added thereto. This mixture was stirred at room temperature for 2 hours.

To the reaction mixture was added 40 g of pyridine. Subsequently, 42 g of acetic anhydride was added, and this mixture was stirred at room temperature for 2 hours. To this reaction mixture were added 300 ml of water and 300 ml of ethyl acetate to conduct water washing extraction. This operation was conducted three times. The aqueous layer was removed, and the remaining organic layer was distilled under vacuum to remove the residual water and ethyl acetate.

The resin solution obtained had a solid concentration of 25%. Thus, a p-hydroxystyrene/p-(isobutoxyethoxy)-styrene/acetyloxystyrene copolymer (70/20/10)(weight-average molecular weight, 12,000) was obtained.

RESIN SYNTHESIS EXAMPLE 3 (PHS/iBES/tBOCS)

In 1,800 ml of propylene glycol monomethyl ether acetate was dissolved 360 g of poly(p-hydroxystyrene) (weight-average molecular weight, 11,000). This solution was subjected to vacuum distillation. After the solution was ascertained to have a sufficiently low water content, 84.0 g of isobutyl vinyl ether and 0.1 g of p-toluenesulfonic acid were added thereto. This mixture was stirred at room temperature for 2 hours.

To the reaction mixture was added 40 g of pyridine. Subsequently, 42 g of dicarbonate was added, and this mixture was stirred at room temperature for 2 hours. To this reaction mixture were added 300 ml of water and 300 ml of ethyl acetate to conduct water washing extraction. This operation was conducted three times. The aqueous layer was removed, and the remaining organic layer was distilled under vacuum to remove the residual water and ethyl acetate.

The resin solution obtained had a solid concentration of 25%. Thus, a p-hydroxystyrene/p-(isobutoxyethoxy)-styrene/tert-butyloxycarbonyloxystyrene copolymer (70/20/10) (weight-average molecular weight, 12,000) was obtained.

RESIN SYNTHESIS EXAMPLE 4 (PHS/iBES) (conventional process)

In 1,800 ml of anhydrous THF were dissolved 360 g of poly(p-hydroxystyrene)(weight-average molecular weight, 11,000) and 126.0 g of isobutyl vinyl ether. Thereto was added 0.1 g of p-toluenesulfonic acid. The resultant solution was stirred at room temperature for 2 hours.

To the reaction mixture was added 0.2 g of triethylamine. This mixture was poured into 3 liters of water, and the fine particles precipitated were taken out by filtration, washed with water, and dried. Thus, a p-hydroxystyrene/p-(isobutoxyethoxy)styrene copolymer (70/30) (weight-average molecular weight, 12,000) was obtained.

RESIN SYNTHESIS EXAMPLE 5 (PHS/iBES/AcS)(conventional process)

In 1,800 ml of anhydrous THF were dissolved 360 g of poly(p-hydroxystyrene)(weight-average molecular weight, 11,000) and 126.0 g of isobutyl vinyl ether. Thereto was added 0.1 g of p-toluenesulfonic acid. The resultant solution was stirred at room temperature for 2 hours.

To the reaction mixture was added 40 g of pyridine. Subsequently, 42 g of acetic anhydride was added, and this mixture was stirred at room temperature for 2 hours.

The reaction mixture was poured into 3 liters of water, and the fine particles precipitated were taken out by filtration, washed with water, and dried. Thus, a p-hydroxystyrene/p-(isobutoxyethoxy)styrene/acetyloxystyrene copolymer (70/20/10)(weight-average molecular weight, 12,000) was obtained.

RESIN SYNTHESIS EXAMPLE 6 (PHS/iBES/tBOCS)(conventional process)

In 1,800 ml of anhydrous THF were dissolved 360 g of poly(p-hydroxystyrene)(weight-average molecular weight, 11,000) and 126.0 g of isobutyl vinyl ether. Thereto was added 0.1 g of p-toluenesulfonic acid. The resultant solution was stirred at room temperature for 2 hours.

To the reaction mixture was added 40 g of pyridine. Subsequently, 42 g of anhydrous di-t-butyl dicarbonate was added, and this mixture was stirred at room temperature for 2 hours.

The reaction mixture was poured into 3 liters of water, and the fine particles precipitated were taken out by filtration, washed with water, and dried. Thus, a p-hydroxystyrene/p-(isobutoxyethoxy)styrene/tert-butyloxycarbonyloxystyrene copolymer (70/20/10)(weight-average molecular weight, 12,000) was obtained.

Preparation and Evaluation of Photosensitive Compositions

Resists were prepared using the compounds obtained in the Synthesis Examples. The formulations used are shown in

TABLE 1

| | Resin having acid-decomposable groups (synthesis method) (solid content, g) | Photo-acid generator (g) | Dissolution inhibitive compound (g) | Acid decomposable group |
|---|---|---|---|---|
| Ex. 1 | PHS/iBES 2.0 (solution process (Synthesis Example 1)) | PAG4-5 0.04 | | |
| Ex. 2 | PHS/iBES/AcS 2.0 (solution process (Synthesis Example 2)) | PAG4-5 0.04 | | |
| Ex. 3 | PHS/iBES/tBOCS 2.0 (solution process (Synthesis Example 3)) | PAG4-5 0.04 | | |
| Ex. 4 | PHS/iBES/AcS 1.6 (solution process (Synthesis Example 2)) | PAG4-5 0.04 | Compound 60 0.4 | TBME |
| Ex. 5 | PHS/iBES/tBOCS 1.6 (solution process (Synthesis Example 3)) | PAG4-5 0.04 | Compound 60 0.4 | TBME |
| Comp. Ex. 1 | PHS/iBES 2.0 (convectional process (Synthesis Example 4)) | PAG4-5 0.04 | | |
| Comp. Ex. 2 | PHS/iBES/AcS 2.0 (convectional process (Synthesis Example 5)) | PAG4-5 0.04 | | |
| Comp. Ex. 3 | PHS/iBES/tBOCS 2.0 (convectional process (Synthesis Example 6)) | PAG4-5 0.04 | | |

The abbreviations used in Table 1 have the following meanings.

<Polymers> The ratios given in parentheses are by mole.

PHS/iBES: p-hydroxystyrene/p-(1-isobutoxyethoxy) styrene copolymer (70/30); weight-average molecular weight, 12,000

PHS/iBES/AcS: p-hydroxystyrene/p-(1-isobutoxyethoxy)-styrene/acetoxystyrene copolymer (70/20/10); weight-average molecular weight, 12,000

PHS/iBES/tBOCS: p-hydroxystyrene/p-(1-isobutoxyethoxy)-styrene/p-(t-butoxycarbonyloxy) styrene copolymer (70/20/10); weight-average molecular weight, 12,000

<Acid-decomposable Group in Dissolution Inhibitive Compound>

TBME: t-butylcarbonyloxymethyl group

To each mixture shown in Table 1 was added 0.02 g of triphenylimidazole. The resultant mixture was dissolved in 9.5 g of propylene glycol monomethyl ether acetate, and this solution was filtered through a 0.2 μm filter to prepare a resist solution. Each resist solution was applied to a silicon wafer with a spin coater, and the coating was dried at 110° C. for 90 seconds with a vacuum suction type hot plate to obtain a resist film having a thickness of 0.83 μm.

These resist films were exposed to light using a 248 nm KrF excimer laser stepper (NA=0.42). Immediately after the exposure, the resist films each was heated with a 100° C. vacuum suction type hot plate for 60 seconds, subsequently immersed for 60 seconds in a 2.38% aqueous solution of tetramethylammonium hydroxide (TMAH), rinsed with water for 30 seconds, and then dried. The thus-obtained resist patterns on silicon wafers were evaluated for profile, sensitivity, and resolution by the following methods and compared.

[Profile]

The thus-obtained resist patterns on silicon wafers were examined with a scanning electron microscope to evaluate the profile of each pattern.

[Sensitivity]

Sensitivity is expressed in terms of the exposure amount necessary for reproducing a 0.50 μm mask pattern.

[Resolution]

Resolution is expressed in terms of threshold resolution at the exposure amount necessary for reproducing a 0.50 μm mask pattern.

The chemical amplification type positive photosensitive compositions according to the present invention each was superior in sensitivity, resolution, and profile to the photosensitive compositions prepared in the Comparative Examples. The resist films obtained from these compositions according to the invention were so stable that they had excellent heat resistance and suffered no change in performance during PED.

Furthermore, the compositions. according to the present invention were found to be highly effective against development defects as shown in Table 2. The examination of each composition for development defects was made by a method in which the resist fluid was applied to a 6-inch wafer and the number of foreign particles corresponding to development defects was counted.

TABLE 2

| | Development defects |
|---|---|
| Example 1 | very few |
| Example 2 | very few |
| Example 3 | very few |
| Example 4 | Few |
| Example 5 | Few |
| Comparative Example 1 | great many |
| Comparative Example 2 | great many |
| Comparative Example 3 | great many |

According to the present invention, a chemical amplification type positive photosensitive composition can be provided which has high sensitivity, high resolution, and excellent heat resistance, suffers no performance change during PED, and is satisfactory in profile. In particular, the chemical amplification type positive photosensitive composition which can be provided by the present invention is exceedingly effective against development defects and lithography defects and has an outstanding performance with respect to freedom from development defects.

While the invention has been described in detail and with reference to specific embodiments thereof, it will be apparent to one skilled in the art that various changes and modifications can be made therein without departing from the spirit and scope thereof.

What is claimed is:

1. A positive photosensitive composition comprising (a) a compound which generates an acid upon irradiation with actinic rays or a radiation and (b) a resin having groups which decompose by the action of an acid to enhance solubility in an alkaline developing solution, said resin being obtained by reacting an alkali-soluble resin having phenolic hydroxyl groups with at least one compound represented by the following general formula (I) under acid conditions in at least one organic solvent selected from the group consisting of ethylene glycol monomethyl ether, ethylene glycol monoethyl ether, ethylene glycol monopropyl ether, ethylene glycol monobutyl ether, ethylene glycol monomethyl ether acetate, ethylene glycol monoethyl ether acetate, ethylene glycol monopropyl ether acetate, ethylene glycol monobutyl ether acetate, diethylene glycol dimethyl ether, diethylene glycol diethyl ether, diethylene glycol dipropyl ether, diethylene glycol dibutyl ether, propylene glycol monomethyl ether, propylene glycol monoethyl ether, propylene glycol monopropyl ether, propylene glycol monobutyl ether, propylene glycol dimethyl ether, propylene glycol diethyl ether, propylene glycol dipropyl ether, propylene glycol dibutyl ether, propylene glycol monomethyl ether acetate, propylene glycol monoethyl ether acetate, propylene glycol monopropyl ether acetate, propylene glycol monobutyl ether acetate, propylene glycol methyl ether propionate, propylene glycol ethyl ether propionate, propylene glycol propyl ether propionate, propylene glycol butyl ether propionate, methyl lactate, ethyl lactate, n-propyl lactate, isopropyl lactate, n-butyl lactate, isobutyl lactate, methyl formate, ethyl formate, n-propyl formate, isopropyl formate, n-butyl fornate, isobutyl formate, n-amyl formate, isoamyl formate, methyl acetate, ethyl acetate, n-propyl acetate, isopropyl acetate, n-butyl acetate, isobutyl acetate, n-amyl acetate, isoamyl acetate, methyl propionate, ethyl propionate, n-propyl propionate, isopropyl propionate, n-butyl propionate, isobutyl propionate, n-amyl propionate, isoamyl propionate, methyl butyrate, ethyl butyrate, n-propyl butyrate, isopropyl butyrate, n-butyl butyrate, isobutyl butyrate, n-amyl butyrate, isoamyl butyrate, ethyl hydroxyacetate, ethyl 2-hydroxy-2-methylpropionate, methyl 2-hydroxy-3-methylbutyrate, ethyl methoxyacetate, ethyl ethoxyacetate, methyl 3-methoxypropionate, ethyl 3-methoxypropionate, methyl 3-ethoxypropionate, ethyl 3-ethoxypropionate, 3-methoxybutyl acetate, 3-methyl-3-methoxybutyl acetate, 3-methyl-3-methoxybutyl butyrate, methyl acetoacetate, ethyl acetoacetate, methyl pyruvate, ethyl pyruvate, toluene, xylene, methyl ethyl ketone, methyl propyl ketone, methyl butyl ketone, 2-heptanone, 3-heptanone, 4-heptanone, and cyclohexanone:

General Formula (1)

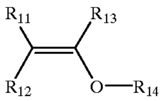

wherein $R_{11}$ to $R_{13}$ may be the same or different, and each represents a hydrogen atom, an alkyl group, an allyl group, an aralkyl group, or a cycloalkyl group; and $R_{14}$ represents an alkyl group, an allyl group, an aralkyl group, or a cycloalkyl group; provided that either $R_{11}$ and $R_{13}$ or $R_{11}$ and $R_{12}$ may be bonded to each other to form either a five- to ten-membered carbon atom ring or a hetero ring containing at least one selected from the group consisting of —O—, —S—, —$SO_2$—, and —$N(R_{15})$—, wherein $R_{15}$ represents an alkyl group, an allyl group, or an aralkyl group, and that $R_{12}$ and $R_{14}$ may be bonded to each other to form a five- to eight-membered ring containing the oxygen atom and carbon atoms, wherein the resin (b) is a resin synthesized by dissolving an alkali-soluble resin having phenolic hydroxyl groups in the organic solvent, subjecting the resultant solution to vacuum distillation, then adding at least one compound represented by general formula (I) to react the same with the alkali-soluble resin, neutralizing the resultant reaction mixture with a base, subsequently washing and extracting the organic layer with water, and then conducting vacuum distillation.

2. The positive photosensitive composition of claim 1, which contains a low-molecular, acid-decomposable, dissolution inhibitive compound having a molecular weight of 3,000 or lower which has one or more groups decomposable by the action of an acid and shows enhanced solubility in an alkaline developing solution by the action of an acid.

* * * * *